US012772916B2

(12) United States Patent
Masuda et al.

(10) Patent No.: US 12,772,916 B2
(45) Date of Patent: Oct. 20, 2026

(54) POWER SEMICONDUCTOR MODULE AND POWER CONVERSION DEVICE

(71) Applicant: HITACHI POWER SEMICONDUCTOR DEVICE, LTD., Ibaraki (JP)

(72) Inventors: Toru Masuda, Tokyo (JP); Daisuke Ikarashi, Tokyo (JP); Kan Yasui, Ibaraki (JP); Takayuki Kushima, Ibaraki (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 370 days.

(21) Appl. No.: 18/572,832

(22) PCT Filed: May 17, 2022

(86) PCT No.: PCT/JP2022/020544

§ 371 (c)(1),
(2) Date: Dec. 21, 2023

(87) PCT Pub. No.: WO2023/042482

PCT Pub. Date: Mar. 23, 2023

(65) Prior Publication Data

US 2024/0290698 A1 Aug. 29, 2024

(30) Foreign Application Priority Data

Sep. 17, 2021 (JP) ................................ 2021-152614

(51) Int. Cl.

*H10W 90/00* (2026.01)
*H02M 7/537* (2006.01)

(52) U.S. Cl.

CPC ......... *H10W 90/701* (2026.01); *H10W 90/00* (2026.01); *H10W 90/401* (2026.01); *H02M 7/537* (2013.01); *H10W 90/754* (2026.01)

(58) Field of Classification Search

CPC . H10W 90/701; H10W 90/00; H10W 90/401; H10W 90/754; H10W 44/501;

(Continued)

(56) References Cited

U.S. PATENT DOCUMENTS

2017/0077068 A1 3/2017 Horio et al.
2018/0138100 A1 5/2018 Iwahashi (Continued)

FOREIGN PATENT DOCUMENTS

JP 2013-138234 A 7/2013
JP 2014-067897 A 4/2014

(Continued)

OTHER PUBLICATIONS

Partial Supplementary European Search Report received in corresponding European Application No. 22869633.2 dated Aug. 20, 2025.

(Continued)

*Primary Examiner* — Yasser A Abdelaziez
(74) *Attorney, Agent, or Firm* — MATTINGLY & MALUR, PC

(57) ABSTRACT

A semiconductor module comprises: an insulating substrate having a main terminal, a conductor layer, and a sense terminal; an insulating substrate disposed opposite the insulating substrate and having a conductor layer; and a sensing spacer conductor which is electrically connected to the sense terminal and electrically connects from the insulating substrate side to the conductor layer of the insulating substrate while keeping an interval between the insulating substrate and the insulating substrate. One sensing spacer conductor (Continued)

corresponds to a plurality of semiconductor switching elements.

20 Claims, 11 Drawing Sheets

(58) Field of Classification Search
CPC ......... H10W 72/5445; H10W 72/5475; H10W 72/884; H10W 72/926; H10W 90/734; H10W 70/611; H02M 7/537; H02M 7/003; H02M 7/48
See application file for complete search history.

(56) References Cited

U.S. PATENT DOCUMENTS

| | | | | |
|---|---|---|---|---|
| 2020/0312729 | A1* | 10/2020 | Hoya | H10P 74/207 |
| 2021/0066175 | A1* | 3/2021 | Kondo | H05K 3/103 |
| 2021/0074647 | A1 | 3/2021 | Hirao et al. | |
| 2021/0280483 | A1* | 9/2021 | Nagasaki | H10W 40/778 |

FOREIGN PATENT DOCUMENTS

| | | | |
|---|---|---|---|
| JP | 2017-017283 | A | 1/2017 |
| JP | 2019-169666 | A | 1/2020 |
| JP | 2020-018137 | A | 1/2020 |
| WO | 2017/163612 | A | 9/2017 |

OTHER PUBLICATIONS

International Search Report of PCT/JP2022/020544 dated Aug. 16, 2022.

* cited by examiner

POWER SEMICONDUCTOR MODULE AND POWER CONVERSION DEVICE

TECHNICAL FIELD

The present invention relates to a power semiconductor module and a power conversion device.

BACKGROUND ART

A power semiconductor module, which is a single module on which a plurality of semiconductor elements (semiconductor chips), for example, switching elements such as power metal oxide semiconductor field effect transistors (power MOSFETs) and insulated gate bipolar transistors (IGBTs) and diode elements such as freewheel diodes are mounted is used for power control and motor control of industrial equipment, electric railway vehicles, automobiles, home electric appliances, and the like. The power semiconductor module includes a plurality of parallelly connected power semiconductor chips on the same substrate.

In recent years, gallium nitride (GaN) or silicon carbide (SiC) is used as a material of power semiconductor chips to utilize advantages such as high switching speed and high operating temperature over semiconductor elements using silicon (Si). At present, since GaN elements and SiC elements are small in size, a plurality of power semiconductor chips have to be connected in parallel and mounted on an insulating substrate of a module to form a power semiconductor module satisfying a predetermined current capacity. In addition, to reduce the volume of a power conversion circuit on which the power semiconductor module is mounted, the operating temperature of a mounted power semiconductor chip needs to be reduced to improve reliability of the module while downsizing the module.

PTL 1 discloses a power semiconductor module in which a first conductor plate electrically connecting a collector electrode of a power semiconductor chip and a second conductor plate electrically connecting an emitter electrode of the power semiconductor chip are used to suppress self-heating due to a loss in the power semiconductor chip, where each of the first conductor plate and second conductor plate is provided with a heat transfer surface on the opposite of a surface bonded to the power semiconductor chip to improve heat dissipation performance.

PTL 2 describes a power semiconductor device in which a plurality of submodules each storing a plurality of power semiconductor elements are used, a plurality of power semiconductor chips are sandwiched by two conductors, that is, a drain conductor 20 and a source conductor 10, and mounted in the submodule, a protrusion 11 that performs a sense function of electrically transmitting a potential from the source conductor 10 is provided to each chip, and the protrusion 11 also serves as a spacer structure that equally determines a physical distance between the drain conductor 20 and the source conductor 10.

CITATION LIST

Patent Literatures

PTL 1: JP 2014-67897 A
PTL 2: JP 2019-169666 A

SUMMARY OF INVENTION

Technical Problem

A power module described in PTL 1 has a structure in which a connection is made by an upper arm signal conductor 324U2 provided on the further outer side than an end portion (a side) of a DC positive electrode conductor plate 315 and a metal bonding material 160 using an AC conductor plate 318 having a thin spacer-shaped protrusion that protrudes as illustrated in FIGS. 13 and 17 in PTL 1, so that the size of the AC conductor plate 318 is large and high accuracy is required to position the AC conductor plate 318, which may degrade the manufacturing yield. In addition, the shape of the conductor plate is restricted.

The power module described in PTL 2 can improve assemblability of a power semiconductor device, but has a problem in downsizing. That is, to improve assemblability, for example, a submodule is provided with four protrusions 11 on a source conductor 10 for four semiconductor elements. Thus, spaces for connecting the four protrusions 11 are needed, and a planar area needed for the submodule is larger than an area needed for the four semiconductor elements. Not only for the sense wiring, an area for gate wiring for transmitting a gate drive signal to the semiconductor element is also needed. Thus, in the configuration of PTL 2, the area of the submodule disadvantageously becomes large.

Furthermore, to operate a plurality of power semiconductor chips connected in parallel, the power semiconductor module needs to be designed so that unnecessary noise voltage and noise current will not be superposed on a gate drive signal for an operation. Among terminals, a source sense terminal used as a pair with a gate signal terminal is important. Thus, it is widely known that the source sense terminal is wired at a portion where a large switching current does not flow to suppress superposition of noise voltage. Meanwhile, the device described in PTL 2 has a structure in which a plurality of submodules are combined to cause a large current flowing in a source to flow via an outerside-source conductor 110. Thus, focusing on the submodule, the protrusions 11 having a source sense function are provided but the structure of the submodule allows a large current to flow in the source conductor 10 itself, and therefore a problem is present that a large current and a noise voltage generated by the impedance of the path for the large current are superposed in the protrusion 11.

For the power semiconductor module having a structure in which a plurality of power semiconductor chips are sandwiched between two conductors as described in PTL 1 and PTL 2, there no description of measures for reducing superposition of noise voltage on a gate drive voltage and measures for reducing the area of the power semiconductor module.

The present invention has been made in view of such issues. An object of the present invention is to provide a small power semiconductor module and a power conversion device that adopt a wiring path for an emitter sense terminal or a source sense terminal capable of reducing superposition of noise voltage on a gate drive voltage.

Solution to Problem

To solve the problem described above, a power semiconductor module according to the present invention is a semiconductor module including a high potential terminal, a first conductor plate electrically connected to the high potential terminal, a plurality of power semiconductor chips of which drains or collectors are connected to the first conductor plate, a second conductor plate connected to sources or emitters of the plurality of semiconductor chips and disposed to face the first conductor plate, a low potential terminal electrically connected to the second conductor plate, a sense terminal configured to detect potentials of the sources or emitters of the plurality of semiconductor chips, a first substrate on which the high potential terminal, the first conductor plate, and the sense terminal are provided, a second substrate disposed to face the first substrate and provided with the second conductor plate, and a sense spacer conductor that is electrically connected to the sense terminal, keeps a gap between the first substrate and the second substrate, and is electrically connected to the second conductor plate, from the side close to the first substrate, of the second substrate, where the sense spacer conductor, which is single, corresponds to the plurality of semiconductor chips, the high potential terminal is provided at a first side of the first substrate, the sense spacer conductor and the plurality of semiconductor chips are disposed on the same portion of the first side, and a shortest distance between the sense spacer conductor and the first side is smaller than a shortest distance between a semiconductor chip closest to the high potential terminal, among the plurality of semiconductor chips, and the first side.

Advantageous Effects of Invention

According to the present invention, a small power semiconductor module and a power conversion device can be provided that adopt a wiring path for an emitter sense terminal or a source sense terminal capable of reducing superposition of noise voltage on a gate drive voltage.

DESCRIPTION OF EMBODIMENTS

Hereinafter, embodiments of the present invention will be described in detail with reference to the drawings.

First Embodiment

A power semiconductor module of a first embodiment of the present invention will be described. In the present embodiment, a configuration for reducing the size of a power semiconductor module, that is, the area occupied by a power semiconductor module including two insulating substrates will be described. In the present embodiment, an effect of reducing noise voltage and noise current generated in a sense wiring that detects a reference potential of a gate drive signal of a semiconductor switching element mounted in a module to stabilize gate controllability, and thereby reducing a loss during switching will be described.

[Schematic Configuration]

Figure 1:
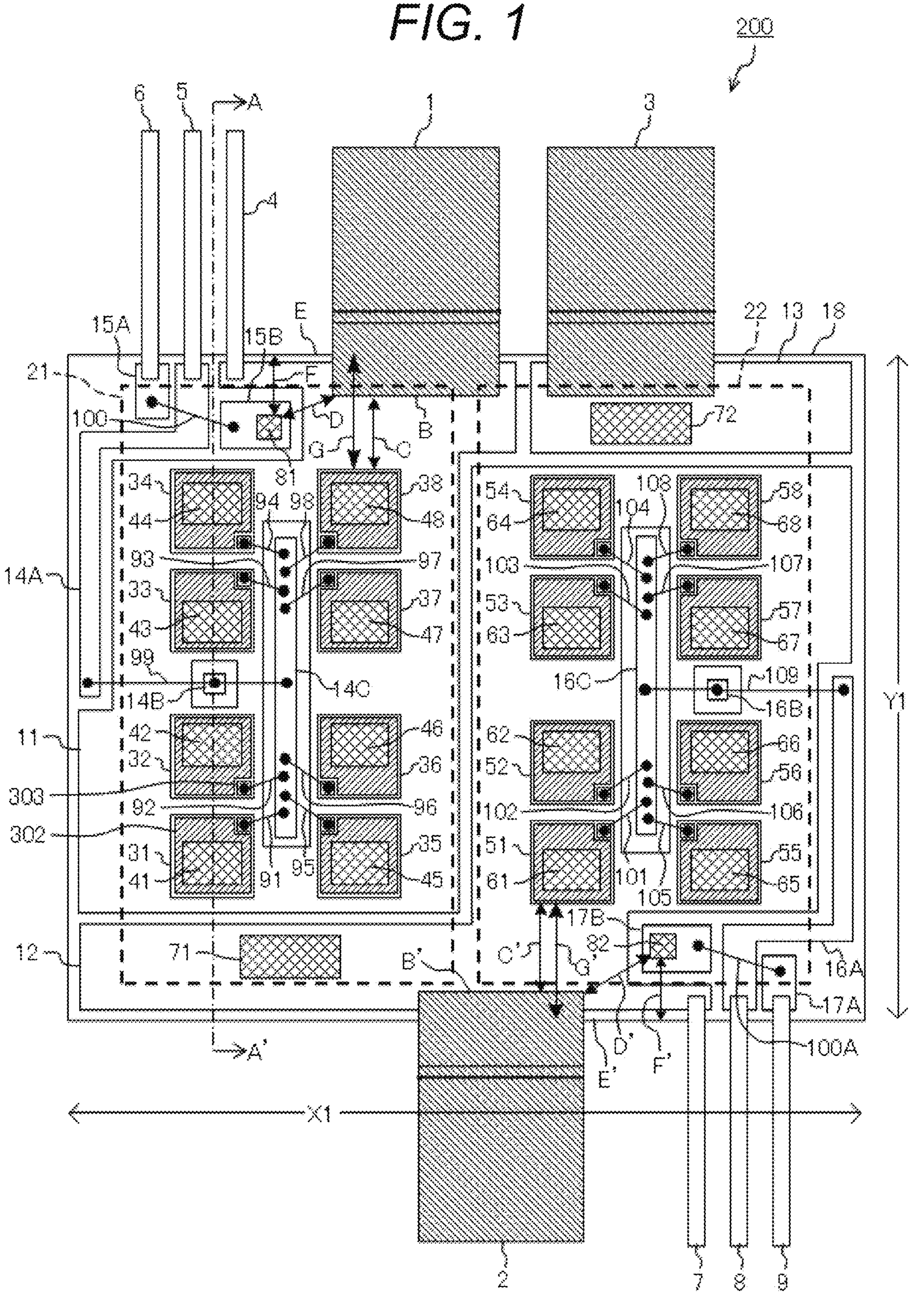
FIG. 1 is a plan view illustrating a schematic configuration of a power semiconductor module of a first embodiment of the present invention.
Figure 2:
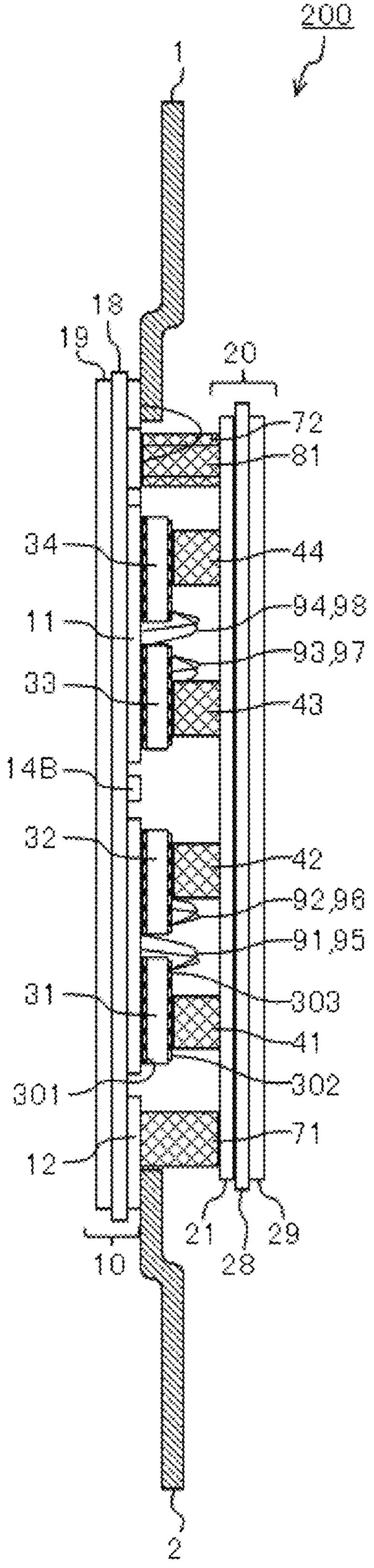
FIG. 2 is a cross-sectional view taken along line A-A' in FIG. 1.

FIG. 1 is a figure illustrating a schematic configuration of a power semiconductor module 200 of the first embodiment of the present invention, and is a plan view of the power semiconductor module 200 as viewed from above. FIG. 2 is a cross-sectional view taken along line A-A' in FIG. 1. In the drawings, the same configurations or configurations having similar functions are denoted by the same reference sign, and detailed description of the same configuration is omitted.

Noted in advance is that in the plan view of FIG. 1, the arrangement of components of a lower layer that is not visible because of components of an upper layer is illustrated as if the components of the upper layer are transparent.

FIG. 1 illustrates an arrangement of a 2-in-1 configuration in which two arm circuits each including a terminal to which a high potential is applied (a DC P-type terminal of an upper arm or an AC terminal of a lower arm), a semiconductor switching element group (semiconductor chip group), and a terminal to which a low potential is applied (an AC terminal of the upper arm or a DC N-type terminal of the lower arm) are connected in series.

<<Upper Arm Circuit Configuration>>

[Cross-Sectional Structure]

The power semiconductor module 200 of the first embodiment of the present invention includes two insulating substrates 10 and 20 disposed to face each other (in this embodiment, the insulating substrate 10 (first substrate, or first insulating substrate) is disposed on the lower side and the insulating substrate 20 (second substrate, or second insulating substrate) is disposed on the upper side to face each other).

In FIGS. 1 and 2, a space where no component is illustrated is filled with an insulating resin. In the following description, the description of the space is omitted unless particularly required.

As illustrated in FIGS. 1 and 2, the insulating substrate 10 disposed in the lower portion of the power semiconductor module 200 includes conductor layers 11 (first conductor plate), 12, and the like on an upper surface (main surface) of an insulating layer 18 and a conductor layer 19 on a lower surface of the insulating layer 18. The insulating substrate 20 disposed in the upper portion of the power semiconductor module 200 includes a conductor layer 29 on an upper surface of an insulating layer 28 and a conductor layers 21 (second conductor plate), 22, and the like on a lower surface (main surface) of the insulating layer 28.

The insulating substrate 10 and the insulating substrate 20 are disposed so as the conductor layer 11 (first conductor plate) and the conductor layer 21 (second conductor plate) face each other (disposed so as the main surfaces to face each other).

Of a plurality of semiconductor switching elements, semiconductor switching elements 31 to 34 (a plurality of semiconductor chips) illustrated in FIG. 2 will be described as an example. In the semiconductor switching elements 31 to 34, an electrode 301 is disposed on one plane and an electrode 302 and a control electrode 303 are disposed on the other plane, so that a current flows from the electrode 301 to the electrode 302 in the up-down direction. On/off of the current is controlled by a voltage applied to the control electrode 303 using the potential of the electrode 302 as a reference. When the semiconductor switching elements 31 to 34 are MOSFET elements, the electrode 301 is a drain electrode, the electrode 302 is a source electrode, and the control electrode 303 is a gate electrode.

To satisfy a predetermined rated current of the power semiconductor module 200, a plurality of semiconductor switching elements 31 to 34 are provided and arranged so as to electrically connect the electrodes 301 to the conductor layer 11 of the insulating substrate 10.

Spacer conductors 41 to 44 have a conductor shape having a height in a direction vertical to a plane of the insulating substrate 10, and electrically connect the electrodes 302 of the semiconductor switching elements 31 to 34 to the conductor layer 21 on the lower surface of the insulating substrate 20. The spacer conductors 41 to 44 serve as mechanical spacers to determine the distance between the electrodes 302 of the semiconductor switching elements 31 to 34 and the conductor layer 21, which is the lower surface of the insulating substrate 20. For electrical connection among the spacer conductors 41 to 44, the electrodes 302, and the conductor layer 21, a bonding technique using solder or a sintered material is used. Semiconductor switching elements 35 to 38 and spacer conductors 45 to 48 illustrated in FIG. 1 are configured in a similar manner. A similar bonding technique is used for spacer conductors 71, 72, 81, and 82 described later.

Like the spacer conductors 41 to 44, the spacer conductors 71, 72, 81 (described later), and 82 (described later) have a conductor shape having a height in a direction vertical to a plane of the insulating substrate 10. The spacer conductors 71 and 81 electrically connect conductor layers 12 and 15B, respectively, of the insulating substrate 10 to the conductor layer 21 of the insulating substrate 20. The spacer conductors 72 and 82 electrically connect conductor layers 13 and 17B, respectively, of the insulating substrate 20 to the conductor layer 22 of the insulating substrate 20.

Spacer conductors 71 and 72 illustrated in FIG. 2 are conductors that electrically connect the conductor layer of the insulating substrate 10 to the conductor layer of the insulating substrate 20 and serve as a path for a large current during switching.

First, focusing on the upper arm circuit, the feature of the present embodiment is that the sense spacer conductor 81 is included.

The sense spacer conductor 81 is electrically connected to the sense terminal 6, keeps the gap between the insulating substrate 10 (first substrate) and the insulating substrate 20 (second substrate), and is electrically connected to the conductor layer 21 (second conductor plate) of the insulating substrate 20 from the side close to the insulating substrate 10.

The sense spacer conductor 81 is used as a sense spacer conductor, and electrically connects the conductor layer 15B (third conductor plate) of the insulating substrate 10 electrically connected to the sense terminal 6 to the conductor layer 21 of the insulating substrate 20. The sense spacer conductor 81 is electrically connected to the sense terminal 6 via the conductor layer 15B, a bonding wire 100, and a conductor layer 15A. Besides serving as an electrical path, the sense spacer conductor 81 serves as a mechanical structure for keeping a parallel gap between the insulating substrate 10 and the insulating substrate 20. The function and positioning of the sense spacer conductor 81 will be described in detail later.

[Connection of Main Terminal]

As illustrated in FIGS. 1 and 2, a main terminal 1 is electrically connected to the conductor layer 11 of the insulating substrate 10 by means such as soldering and metal bonding. The method of connection is not particularly limited. A main terminal 2 is electrically connected to the conductor layer 12 of the insulating substrate 10, and is electrically connected to the conductor layer 21 (second conductor plate) of the insulating substrate 20 via the spacer conductor 71. A main terminal 3 is electrically connected to the conductor layer 13 of the insulating substrate 10, and is electrically connected to the conductor layer 22 of the insulating substrate 20 via the spacer conductor 72.

The main terminal 1 is a DC P-type terminal, the main terminal 2 is an AC terminal, and the main terminal 3 is a DC N-type terminal. In the upper arm, the main terminal 1 is a high potential terminal and the main terminal 2 is a low potential terminal. In the lower arm, the main terminal 2 is a high potential terminal and the main terminal 3 is a low potential terminal.

Focusing on the upper arm circuit, the main terminal 1 and the main terminal 2 are connected to the same insulating substrate 10. From the viewpoint of electrical connection, for example, there is no problem when the main terminal 2 is connected to the conductor layer 21 of the insulating substrate 20. However, in this case, the number of steps of connecting the main terminals increases since it needs two steps, that is, the first step for the insulating substrate 10 and the second step for the insulating substrate 20. A plurality of main terminals and control terminals are often provided as an integrated lead frame part to reduce manufacturing cost. Thus, from the viewpoint of reducing the man-hour for manufacturing, it is desirable that connections are made to the same insulating substrate. Thus, as illustrated in FIG. 2, the present embodiment adopts a structure in which the main terminal 1 and the main terminal 2 are connected to the same insulating substrate. The same applies to the relationship between the main terminal 2 and the main terminal 3 used for the lower arm circuit.

[Planar Configuration]

FIG. 1 is a plan view of the power semiconductor module 200 as viewed from above. For convenience of description, the insulating layer 28 and the conductor layer 29 of the insulating substrate 20 are not illustrated, and the profiles of the conductor layers 21 and 22 are illustrated with broken lines. The conductor layer 19 on the lower surface of the insulating layer 18 of the insulating substrate 10 is also not illustrated.

FIG. 1 illustrates an arrangement of a 2-in-1 configuration in which two arm circuits, each including a terminal to which a high potential is applied, a semiconductor switching element group, and a terminal to which a low potential is applied, are connected in series.

A basic effect of the present invention (present embodiment) can be described by taking one of the arm circuits as an example. Here, the upper arm circuit will be described with the main terminal 1 as an example terminal to which a high potential is applied, the eight elements 31 to 38 as an example of a plurality of semiconductor switching elements, the main terminal 2 as an example terminal to which a low potential is applied, and the gate terminal 5 and the sense terminal 6 (source sense terminal) as example control terminals of the semiconductor switching elements.

Although the type of the semiconductor switching element is not limited, an SiC-MOSFET will be described as an example in the present embodiment.

The sense terminal 6 and the gate terminal 5 are provided at a side E (first side) of the insulating substrate 10 with the main terminal 1 (high potential terminal). The main terminal 2 is provided at a side E' opposite to the side E of the insulating substrate 10.

The semiconductor switching elements 31 to 38 are arranged in a mirror image positional relationship with a gate wiring 14C in the center. Orientations of the chips are determined such that the gate electrodes of the eight semiconductor switching elements 31 to 38 gather at the center. The gate terminal 5 is electrically connected to a conductor layer 14A on the insulating substrate 10, and is connected to the gate wiring 14C via a bonding wire 99 with a conductor layer 14B used as a relay conductor. In the gate wiring 14C, the gate potential is supplied separately in the direction to the main terminal 1 and the direction to the main terminal 2, and the gate wiring 14C is connected to the gate electrodes of the semiconductor switching elements 31 to 38 by bonding wires 91 to 98.

The gate terminal 5 is connected to the gate electrode of each of a plurality of semiconductor switching elements 31 to 38 with an equal electric delay time.

[Sense Spacer Conductor 81]

<Sense Terminal 6>

The sense terminal 6 is electrically insulated from the conductor layer 11 (first conductor plate) of the insulating substrate 10, is connected to the conductor layer 15A disposed on the main surface, on which the conductor layer 11 is disposed, of the insulating substrate 10, and is electrically connected to the conductor layer 21 (second conductor plate) of the insulating substrate 20 via the bonding wire 100, the conductor layer 15B (third conductor plate), and the sense spacer conductor 81.

The degree of superposition of noise voltage and noise current on a source sense potential detected by the sense terminal 6 greatly differs depending on the planar positioning of the sense spacer conductor 81 (planar position at which the sense spacer conductor 81 is connected to the conductor layer 15B and the conductor layer 21).

The degree of superposition of noise voltage and noise current on a source sense potential detected by the source sense terminal greatly differs depending on the position where the sense spacer conductor 81 is positioned on the conductor layer 15B and the conductor layer 21.

<Positioning of Sense Spacer Conductor 81>

Reference signs B, C, D, E, F, and G in FIG. 1 respectively indicate side B, distance C, distance D, side E, distance F, and distance G for explaining the position of the sense spacer conductor 81.

The side B indicated by reference sign B in FIG. 1 indicates an end face at which the main terminal 1 (high potential terminal) to which a high potential is applied is connected to the conductor layer 11 (first conductor plate). Since the main terminal 1 has a long rectangular shape, the end face of the end portion on the module inner direction side is the side B connected to the conductor layer 11 (first conductor plate).

Reference sign C in FIG. 1 indicates the shortest distance from the side B of the conductor layer 11 (first conductor plate) of the insulating substrate 10 to the semiconductor switching element 38 closest to the side B (shortest distance between the main terminal 1 and the semiconductor switching element 38, among a plurality of the semiconductor switching elements 31 to 38, closest to the main terminal 1).

The distance D in FIG. 1 indicates the shortest distance from the side B to the sense spacer conductor 81 (shortest distance between the sense spacer conductor 81 and the main terminal 1).

Side E is a side (first side) of the insulating substrate 10, and the main terminal 1 is provided at the side E. The distance F indicates the shortest distance between the sense spacer conductor 81 and the side E. The distance G indicates the shortest distance between the side E and the semiconductor switching element 38, among a plurality of semiconductor switching elements 31 to 38, closest to the main terminal 1.

In the present embodiment, a single sense spacer conductor 81 corresponds to a plurality of semiconductor switching elements 31 to 38, the sense spacer conductor 81 and a plurality of semiconductor chips 31 to 38 are disposed on the same portion of the side E, and the distance F is smaller than the distance G. By disposing the sense spacer conductor 81 at such a position, the degree of superposition of noise voltage and noise current, due to a main current, on the source sense potential detected by the sense terminal 6 can be reduced.

For the same reason, in the present embodiment, the distance D is desirably smaller than the distance C.

When the number of the sense spacer conductors 81 is too large, superposition of noise voltage and noise current, due to a main current, on the source sense potential detected by the sense terminal 6 is likely to occur. Thus, one sense spacer conductor 81 is enough to correspond to a plurality of semiconductor switching elements 31 to 38 (a plurality of semiconductor chips). In the present embodiment, the number of sense spacer conductors 81 does not depend on the number of a plurality of semiconductor switching elements. In particular, one sense spacer conductor 81 may be disposed corresponding to one arm circuit.

<Positioning of Insulating Substrate 20 and Sense Spacer Conductor 81>

In the conductor layer 21 (second conductor plate) of the insulating substrate 20, the position where a plurality of semiconductor switching elements 31 to 38 are electrically connected to the conductor layer 21 is between the position where the sense spacer conductor 81 is electrically connected and the position where the main terminal 2 (low potential terminal) is electrically connected (the position of the spacer conductor 71, when the main terminal 2 is provided on the insulating substrate 10).

In addition, the positional relationship among the main terminal 1 (high potential terminal), the sense spacer conductor 81, a plurality of semiconductor switching elements 31 to 38, and the main terminal 2 (low potential terminal) is such that the sense spacer conductor 81, a plurality of semiconductor switching elements 31 to 38, and the position where the main terminal 2 is electrically connected to the conductor layer 21 (second conductor plate) of the insulating substrate 20 (the position of the spacer conductor 71, when the main terminal 2 is provided on the insulating substrate 10) are arranged in this order from the position where the main terminal 1 is electrically connected to the conductor layer 11 (first conductor plate) of the insulating substrate 10 (in a side view with reference to FIG. 2).

The upper arm circuit configuration has been described above. A lower arm circuit configuration will be described below. The lower arm circuit configuration is similar to the upper arm circuit configuration, so that repetitive description will be omitted.

<<Lower Arm Circuit Configuration>>

[Cross-Sectional Structure]

As illustrated in FIG. 1, among a plurality of semiconductor switching elements, semiconductor switching element 51 to 58 of the lower arm circuit configuration illustrated in FIG. 1 are similar to the semiconductor switching elements 31 to 38 of the upper arm circuit configuration. That is, also in the lower arm circuit configuration, an electrode similar to the electrode 301 in FIG. 2 is disposed on one plane, and an electrode similar to the electrode 302 in FIG. 2 and an electrode similar to the electrode 303 in FIG. 2 are disposed on the other plane. Thus, also in the lower arm circuit configuration, a current similar to the current that is described to flow in the upper arm circuit configuration from the electrode 301 to the electrode 302 in the up-down direction flows. On/off of the current in the lower arm circuit configuration is also performed in a similar way as described above for the upper arm circuit configuration in which on/off is controlled by the voltage applied to the control electrode 303 with the potential of the electrode 302 used as a reference.

Like in the upper arm circuit configuration, spacer conductors 61 to 68 of the lower arm circuit configuration have a conductor shape having a height in a direction vertical to a plane of the insulating substrate 10, and electrically connect the electrodes 302 of the semiconductor switching element 51 to 58 to the conductor layer 22 (see FIG. 1) on the lower surface of the insulating substrate 20. The lower arm circuit is different from the upper arm circuit in that connection is made not to the conductor layer 21 but to the conductor layer 22. The spacer conductors 61 to 68 determine, as a mechanical spacer, a distance of the gap between the electrodes 302 of the semiconductor switching element 51 to 58 and the conductor layer 22 on the lower surface of the insulating substrate 20.

Like the spacer conductors 61 to 68, the spacer conductors 72 (see FIG. 1) and 82 have a conductor shape having a height in a direction vertical to a plane of the insulating substrate 10, and electrically connect the conductor layers 13 and 17B of the insulating substrate 10 (see FIG. 2) to the conductor layer 22 of the insulating substrate 20.

The sense spacer conductor 82 electrically connects the conductor layer 17B (third conductor plate) of the insulating substrate 10 electrically connected to the sense terminal 9 to the conductor layer 22 of the insulating substrate 20. The sense spacer conductor 82 is electrically connected to the sense terminal 9 via the conductor layer 17B, a bonding wire 100A, and a conductor layer 17A. Besides serving as an electrical path, the sense spacer conductor 82 is a mechanical structure for keeping a parallel gap between the insulating substrate 10 and the insulating substrate 20.

[Planar Configuration]

The semiconductor switching elements 51 to 58 are arranged in a mirror image positional relationship with a gate wiring 16C in the center. Orientations of the chips are determined such that the gate electrodes of the eight semiconductor switching elements 51 to 58 gather at the center. The gate terminal 8 is electrically connected to a conductor layer 16A on the insulating substrate 10, and is connected to a gate wiring 16C via a bonding wire 109 with a conductor layer 16B used as a relay conductor. In the gate wiring 16C, the gate potential is supplied separately in the direction to the main terminal 2 and the direction to the main terminal 3, and is connected to the gate electrodes of the semiconductor switching element 51 to 58 by bonding wires 101 to 108.

[Source Sense Spacer Conductor 82]

The degree of superposition of noise voltage and noise current on a source sense potential detected by the sense terminal 9 greatly differs depending on the planar position of the sense spacer conductor 82 (planar position at which the sense spacer conductor 82 is connected to the conductor layer 17B and the conductor layer 22).

The positional relationship between the sense spacer conductor 82 and the main terminal 2 is similar to the positional relationship between the sense spacer conductor 81 and the main terminal 1. That is, the side B, the distance C, the distance D, the side E, the distance F, and the distance G used for describing the position of the sense spacer conductor 81 respectively correspond to side B', distance C', distance D', side E', distance F', and distance G' for describing the position of the sense spacer conductor 82 and have a similar relationship.

[Effects of Power Semiconductor Module 200]

Effects of the power semiconductor module 200 configured as described above will be described below.

Two effects obtained by the present invention (present embodiment) will be described.

<Reduction of Switching Loss>

Of the two effects obtained by the present invention (present embodiment), the effect of reducing switching loss will be described with reference to a comparative example illustrated in FIGS. 3 and 4.

The upper arm circuit configuration will be described as an example.

Figure 3:
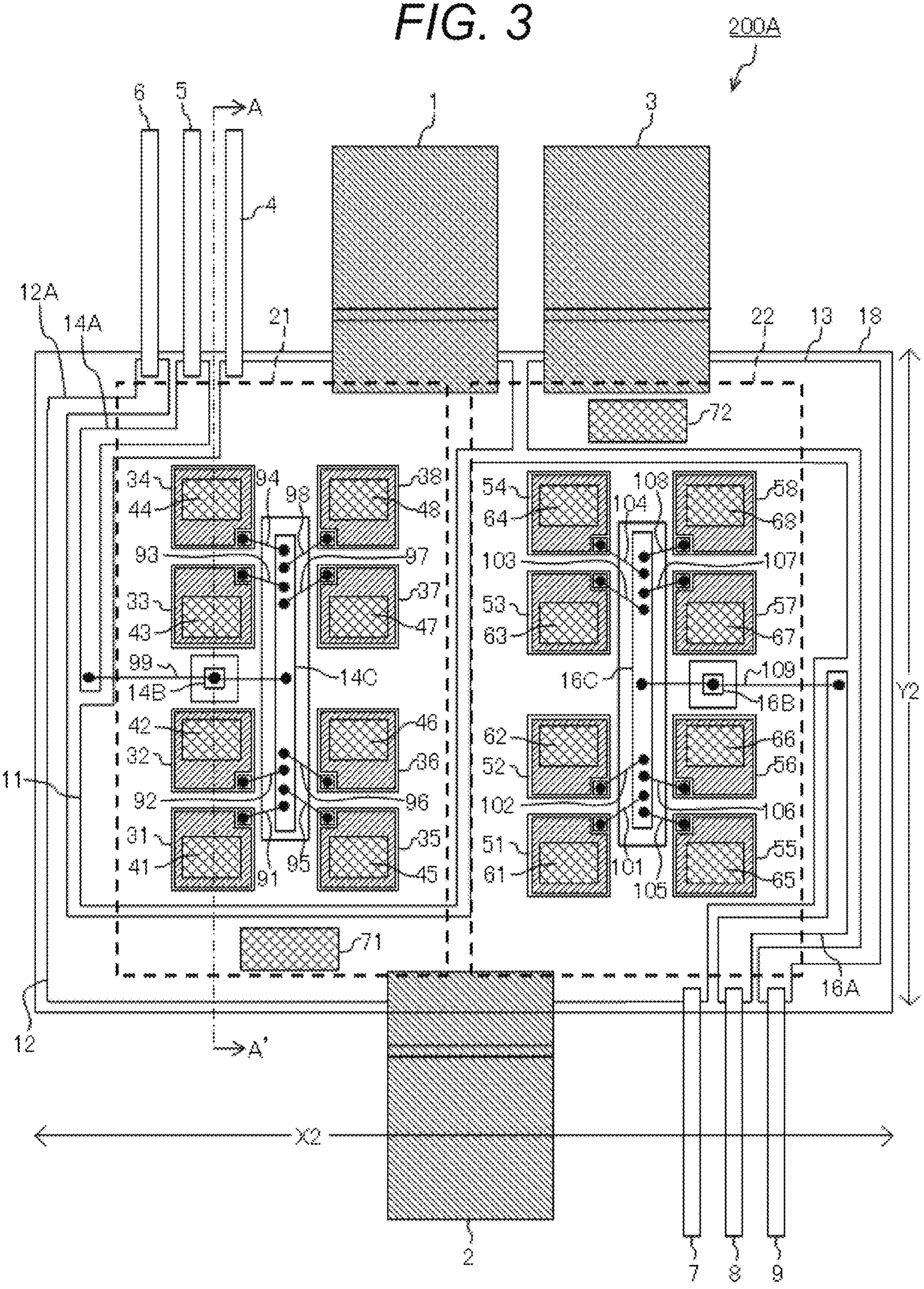
FIG. 3 is a plan view illustrating a schematic configuration of a power semiconductor module of a comparative example.

FIG. 3 is a figure illustrating a schematic configuration of a power semiconductor module 200A of a comparative example, and is a plan view of the power semiconductor module 200A of the comparative example as viewed from above. FIG. 4 is a cross-sectional view taken along line A-A'in FIG. 3. The same components as those in FIGS. 1 and 2 are denoted by the same reference signs, and repetitive description thereof is omitted.

The power semiconductor module 200A of the comparative example has functions same as that of the insulating substrate, the semiconductor switching element, the conductor layer, and the spacer conductor of the power semiconductor module 200 illustrated in FIG. 1.

The power semiconductor module 200A of the comparative example is different from the power semiconductor module 200 illustrated in FIG. 1 in a source sense wiring path from the sense terminal 6.

Figure 4:
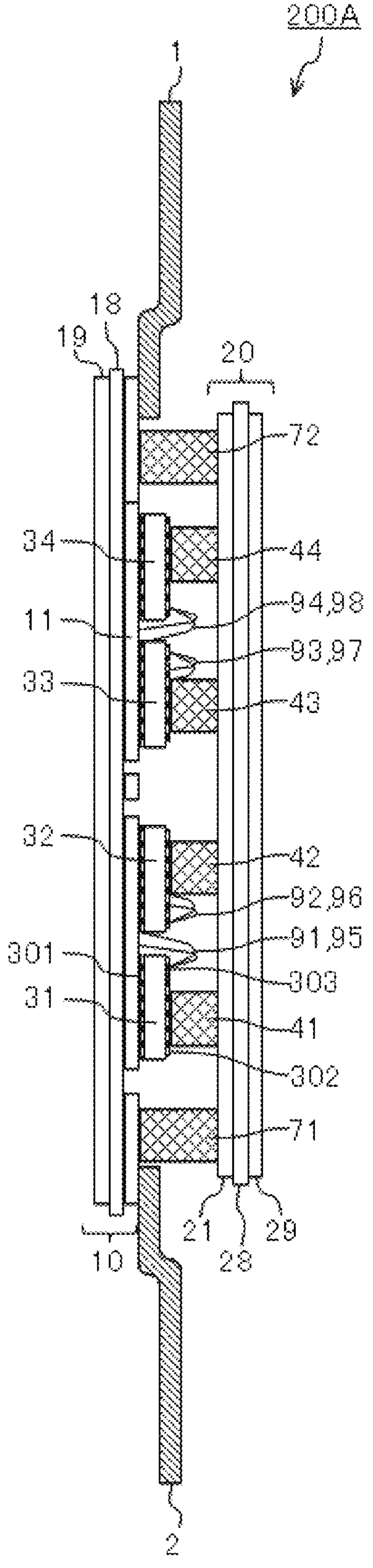
FIG. 4 is a cross-sectional view taken along line A-A' in FIG. 3.

As illustrated in FIGS. 3 and 4, in the power semiconductor module 200A of the comparative example, the source sense terminal 6 is electrically connected to the conductor layer 12 disposed on the insulating substrate 10. Since the power semiconductor module 200A of the comparative example does not include the sense spacer conductor 81, the source sense potentials of a plurality of semiconductor switching elements on the conductor layer 21 on the insulating substrate 20 are obtained by electrical connection to the conductor layer 12 on the insulating substrate 10 via the spacer conductor 71.

Figure 6:
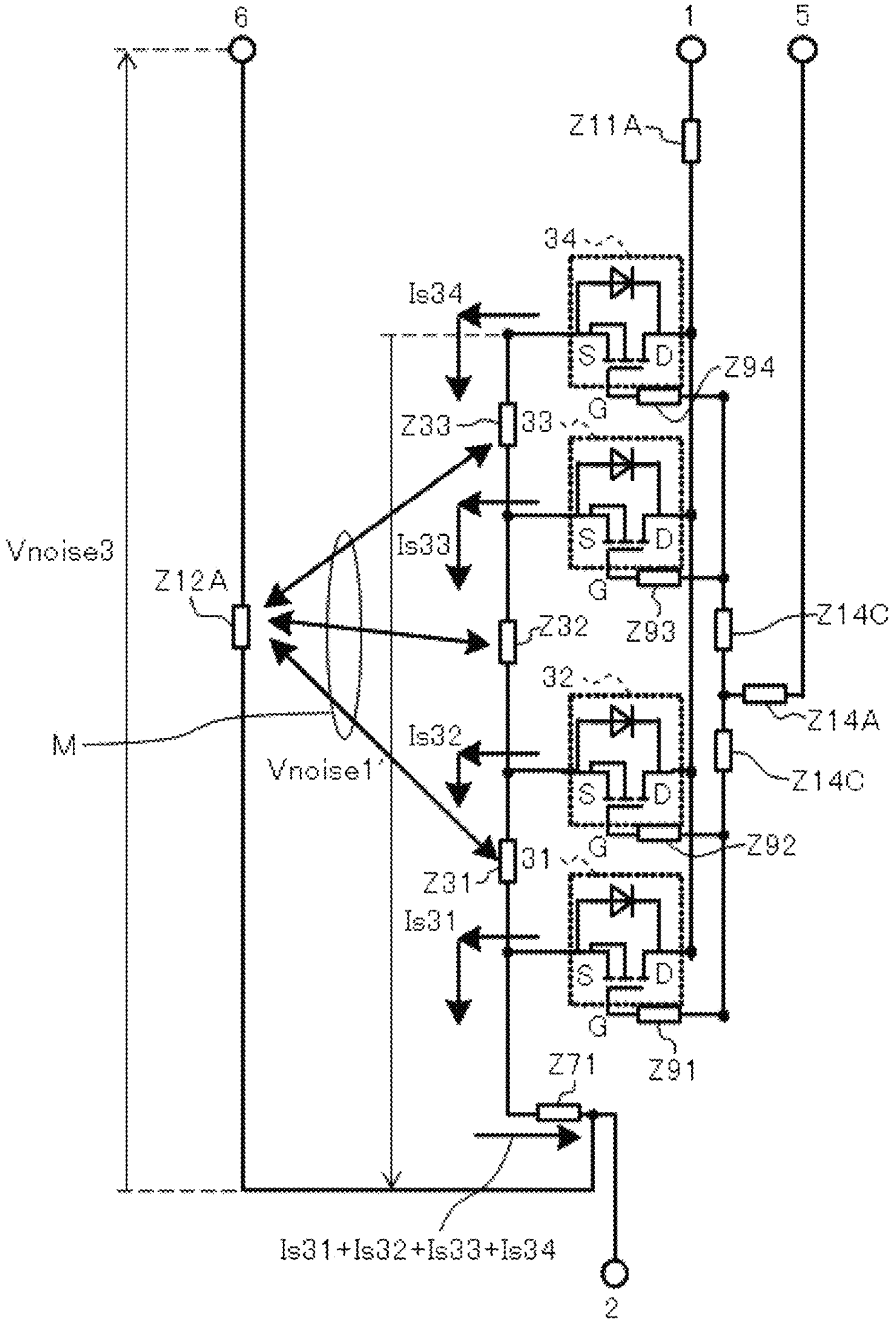
FIG. 6 is an equivalent circuit showing electrical characteristics of a semiconductor switching element as an example in the configuration of the power semiconductor module of the comparative example.

Thus, in the power semiconductor module 200A of the comparative example, the conductor layer 12 is routed from the source sense terminal 6 a long distance on the order of the longitudinal dimension of the substrate (see a routed signal line of the sense terminal 6 in FIG. 6 to be described later), and a noise current from the conductor layer 11 and the conductor layer 21 in which large main currents flowing in and out of a plurality of semiconductor switching elements flow is readily applied by magnetic coupling (see mutual inductance M in FIG. 6 to be described later).

In the detected source sense potential, a noise voltage generated by the main current flowing out of the source electrodes of a plurality of semiconductor switching elements and a parasitic impedance including a parasitic resistance and a parasitic inductor of the conductor layer 21 on the insulating substrate 20 has been superposed.

Furthermore, as described in the technical problem, to simplify the step of connecting the main terminals, it is desirable to connect the main terminals to the conductor layer on the same insulating substrate in terms of manufacturing cost. Thus, the main currents flowing out of the source electrodes of a plurality of semiconductor switching elements are also affected by the parasitic impedance generated in the spacer conductor 71 when the current flows in the spacer conductor 71.

The effect of <reduction of switching loss> will be specifically described with reference to FIGS. 5 and 6.

Power Semiconductor Module 200 of the Present Embodiment

Figure 5:
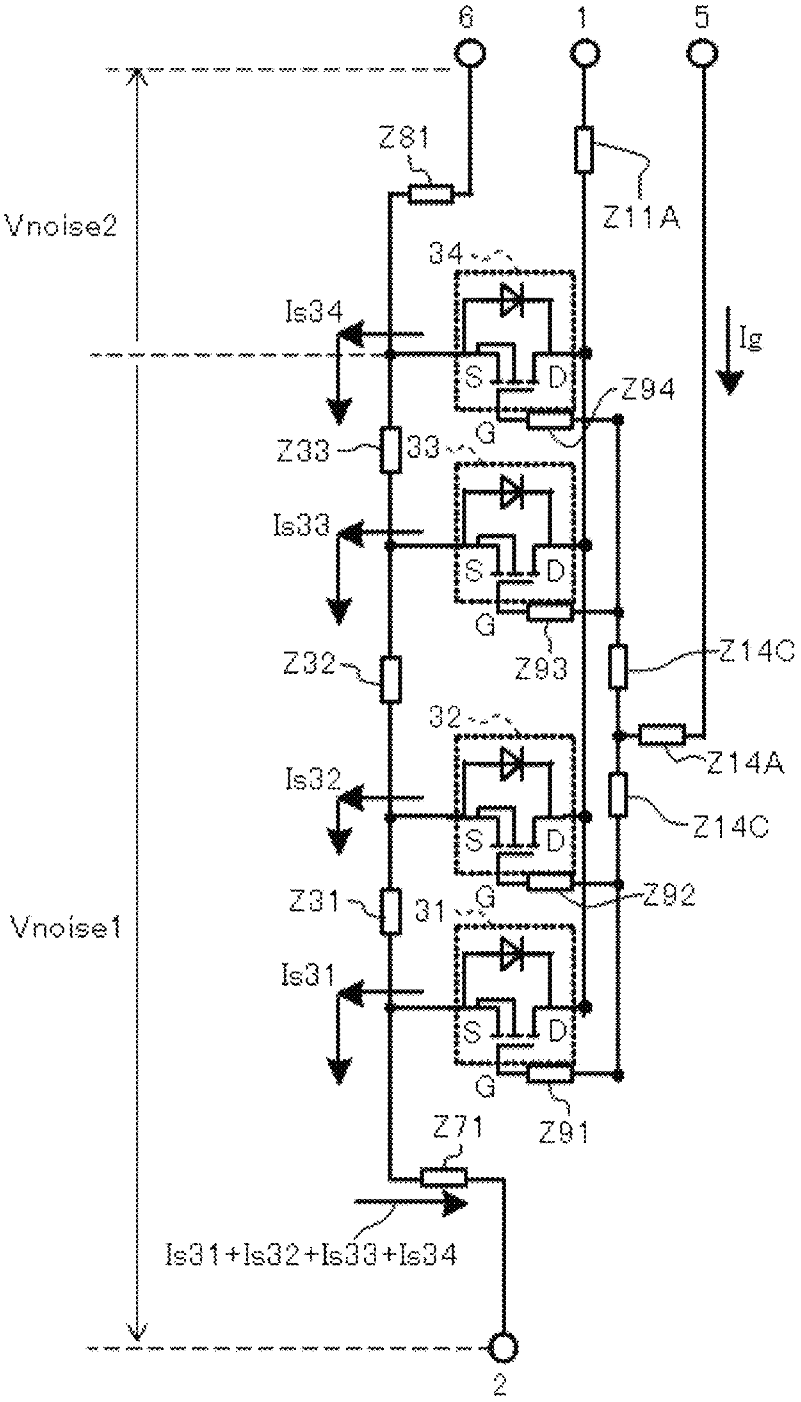
FIG. 5 is an equivalent circuit showing electrical characteristics of a semiconductor switching element as an example in the configuration of the power semiconductor module of the first embodiment of the present invention.

FIG. 5 is an equivalent circuit showing electrical features in which semiconductor switching elements 31 to 34 are taken as an example from the configuration of the power semiconductor module 200 (see FIGS. 1 and 2) of the first present embodiment.

In the equivalent circuit in FIG. 5, the drains of the semiconductor switching elements 31 to 34 are connected to the main terminal 1 to which a high potential is applied, and the sources of the semiconductor switching elements 31 to 34 are connected to the main terminal 2 to which a low potential is applied. Gate control of the semiconductor switching elements 31 to 34 is performed by the gate terminal 5 and the sense terminal 6. In the circuit diagram in FIG. 5, parasitic impedances Z generated due to the structure in FIGS. 1 and 2 are disposed.

Description will be given, focusing on the source potential detected by the source sense terminal 6.

Main currents Is flowing out of the semiconductor switching elements 31 to 34 toward the main terminal 2 flow through the parasitic impedances Z33, Z32, Z31, and Z71. As a result, a noise voltage Vnoise1 determined by the parasitic impedance and the current flowing therethrough is eventually generated.

$$Vnoise1 = (Is34)\times Z33 + (Is33 + Is34)\times Z32(Is32 + Is33 + Is34)\times Z31 + (Is31 + Is32 + Is33 + Is34)\times Z71$$

Is31 to Is34 indicate the source currents of the semiconductor switching elements 31 to 34.

In the power semiconductor module 200 of the present embodiment adopting the configurations in FIGS. 1 and 2, as illustrated in the equivalent circuit in FIG. 5, the potential of the source sense terminal 6 is obtained only through a small parasitic impedance Z81 from the connection of the source electrode of the semiconductor switching element 34. Since the current flowing in the source sense terminal 6 is a feedback current of the gate drive current Ig, the magnitude of the current is equal to Ig, and is 1/100 (or less) at most of the main currents Is flowing out of the semiconductor switching elements 31 to 34, and this indicates that the current is small.

The noise voltage Vnoise2 superposed on the sense potential of the source sense terminal 6 is expressed by the formula: Vnoise2=Ig×Z81. This indicates that Vnoise2 is smaller than Vnoise1. This feature is an effect obtained by disposing the sense spacer conductor 81 in the predetermined positional relationship in the power semiconductor module 200 including the two insulating substrates as described above.

Power Semiconductor Module 200A of Comparative Example

FIG. 6 is an equivalent circuit showing electrical features in which the semiconductor switching elements 31 to 34 are taken as an example from the configuration of the power semiconductor module 200A (see FIGS. 3 and 4) of the comparative example.

As illustrated in the equivalent circuit in FIG. 6, the Vnoise1 described above is superposed on the source sense potential detected by the source sense terminal 6. It can be understood that, although not always true for every magnetic coupling, a noise current is superposed on the current flowing in the source sense terminal 6 by magnetic coupling due to mutual inductance between an impedance Z12A of a routed wiring (part of the conductor layer 12) connecting the source sense terminal 6 and impedances Z31 to Z33 of a wiring (conductor layer 21) in which the source currents of the semiconductor switching elements 31 to 34 flow (see mutual inductance M in FIG. 6) and magnetic coupling due to mutual inductance between the impedance Z12A and the wiring path (conductor layer 11) in which the drain currents (not illustrated in FIG. 6) of the semiconductor switching elements 31 to 34 flow.

Comparison of Waveforms During Switching of Power Semiconductor Modules of the Present Embodiment and the Comparative Example An example of <reduction of switching loss> effect of the present invention will be described by comparing waveforms during switching.

Figure 7:
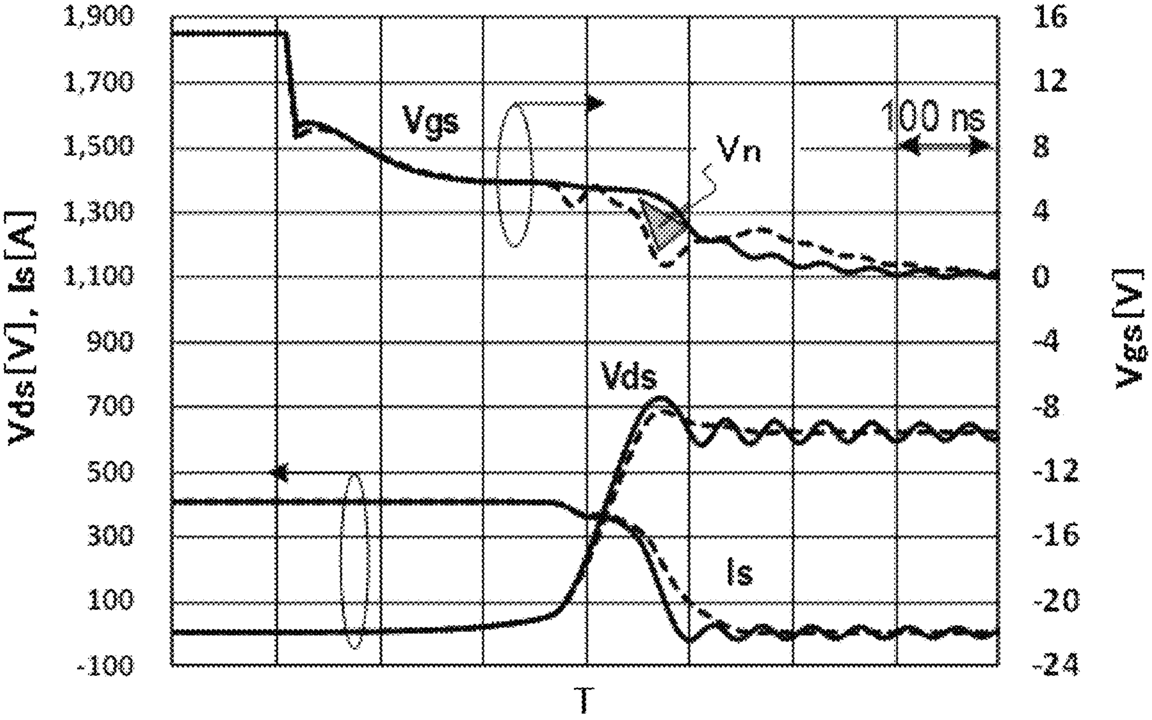
FIG. 7 is a turn-off waveform chart illustrating an example of analysis results of operation waveforms of the power semiconductor modules of the first embodiment of the present invention and the comparative example.
Figure 8:
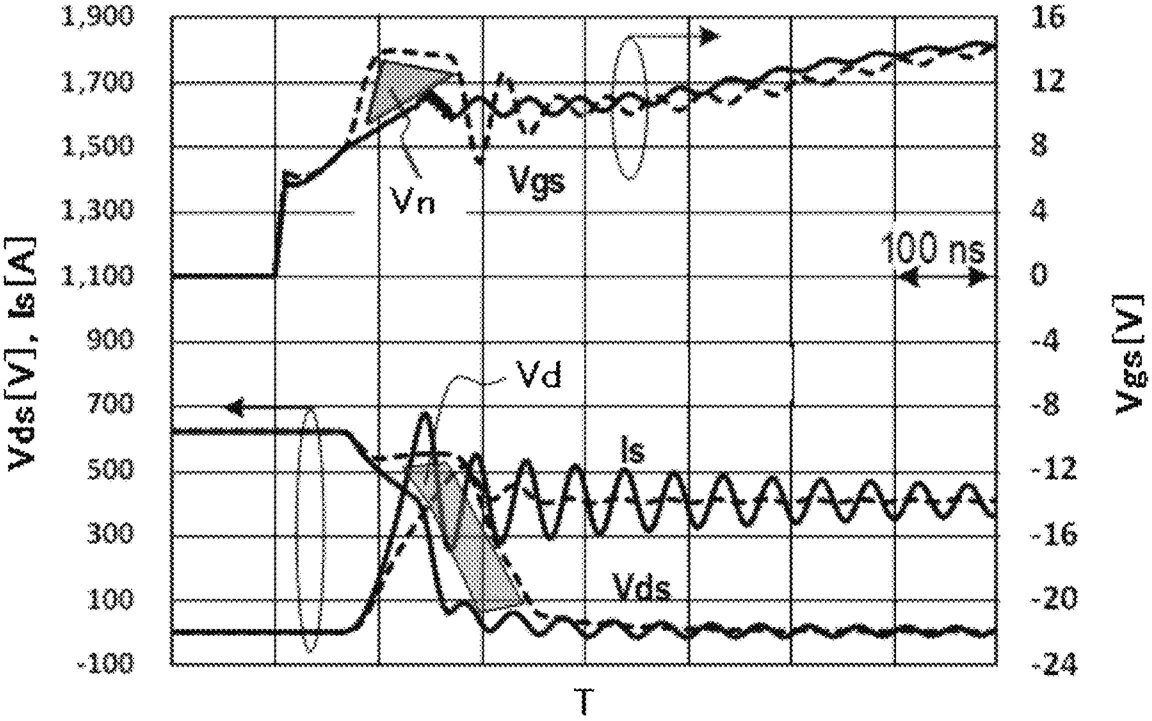
FIG. 8 is a turn-on waveform chart illustrating an example of analysis results of operation waveforms of the power semiconductor modules of the first embodiment of the present invention and the comparative example.

FIGS. 7 and 8 are examples of waveforms during double pulse switching performed using a calculation circuit constructed by simulating the power semiconductor module 200 of the present embodiment (see FIGS. 1 and 2) and the power semiconductor module 200A of the comparative example (see FIGS. 3 and 4).

FIG. 7 is a turn-off waveform chart illustrating an example of analysis results of operation waveforms of the power semiconductor modules 200 and 200A of the present embodiment and the comparative example. FIG. 8 is a turn-on waveform chart illustrating an example of analysis results of operation waveforms of the power semiconductor modules of the present embodiment and the comparative example. In FIGS. 7 and 8, the horizontal axis represents time T, the left vertical axis represents voltage Vds [V] between the main terminal 1 and the main terminal 2, and total sum Is [A] of source currents flowing out of the main terminal 2. The right vertical axis represents differential voltage Vgs [V] between the gate terminal 5 and the source sense terminal 6. The time span of the grid on the horizontal axis is 100 [ns]. The vertical axis indicated by an ellipse and an arrow is referred when reading a waveform in FIGS. 7 and 8.

In FIGS. 7 and 8, characteristics indicated by solid lines are of the case in which the calculation circuit of the power semiconductor module 200 in FIGS. 1 and 2 of the present embodiment is used, and characteristics indicated by broken lines are of the case in which the calculation circuit of the power semiconductor module 200A in FIGS. 3 and 4 of the comparative example is used.

FIG. 7 illustrates the waveform at a turn-off timing among switching events. Vgs represents a transient waveform of the differential voltage between the gate terminal 5 and the source sense terminal 6 illustrated in FIGS. 1 and 2, and Vds represents a transient waveform of the differential voltage between the main terminal 1 and the main terminal 2. Is represents a transient waveform of the sum of the source currents flowing out of the main terminal 2. In FIG. 7, it can be understood that there is a difference between the Vgs waveforms, that is, there is a difference in voltage as indicated by a hatched area (see "noise voltage" Vn) in FIG. 7. This affects the change in Vds and Is. The characteristics of the case using the calculation circuit of the comparative example in FIG. 6 indicated by the broken lines show that Vds and Is both change gently. Thus, the switching loss (loss of power, that is, the integral of the product of Vds and Is) in the characteristics of the case using the calculation circuit of the comparative example in FIG. 6 is large compared to the characteristic of the case using the calculation circuit of the present embodiment in FIG. 5.

From the same view point, the turn-on waveform illustrated in FIG. 8 will be described.

For the turn-on waveforms, the difference between the solid line and the broken line of Vgs waveforms is larger as can be confirmed by the difference in voltage indicated by a hatched area in FIG. 8 (see "deterioration in voltage waveform" Vd). Accordingly, like the turn-off waveforms illustrated in FIG. 7, both Vds and Is change gently, which indicates that a large noise voltage is superposed, in particular, on Vds. Thus, also in the turn-on waveforms, the switching loss in the characteristics of the case using the calculation circuit of the comparative example in FIG. 6 is large compared to the characteristic of the case using the calculation circuit of the present embodiment in FIG. 5.

As described above, the power semiconductor module 200 of the present embodiment (see FIGS. 1 and 2) can reduce the switching loss depending on application and positioning of the sense spacer conductor.

<Downsizing of Module>

Downsizing effect of a module, which is another advantage of the present invention, will be quantitatively described using examples.

In the power semiconductor module 200 of the present embodiment described in FIG. 1, the lateral dimension (in the left-right direction in the sheet) of the insulating substrate 10 is X1, and the longitudinal dimension (in the up-down direction in the sheet) is Y1. Likewise, in the power semiconductor module 200A of the comparative example described in FIG. 3, the lateral dimension (in the left-right direction in the sheet) of the insulating substrate 10 is X2, and the longitudinal dimension (in the up-down direction in the sheet) is Y2. The dimensions Y1 and Y2 may be the same, but as for the lateral dimension, the lateral dimension X2 of the insulating substrate 10 of the power semiconductor module 200A of the comparative example in FIG. 3 is larger than the lateral dimension X1 of the insulating substrate 10 of the power semiconductor module 200 of the present embodiment due to the positioning of the routing portion (conductor layer 12A) of the source sense wiring.

For example, considering the width of a standard wiring pattern of a power semiconductor module having a rated dielectric strength of 1.2 kV and an insulation distance between patterns, an effect of reducing the X1 to 92% of X2 can be obtained. Since the dimension of the insulating substrate 10 is a dominant dimension for determining the dimension of the module when the insulating substrate 10 is designed larger than the insulating substrate 20, the size of the power semiconductor module may be reduced by applying the present invention.

Effects of the present invention obtained by using the effects of the present embodiment are summarized as follows.

(1) The area of an insulating substrate on which a semiconductor switching element is mounted can be reduced.

(2) The size of a power semiconductor module on which the insulating substrate in (1) is mounted can be reduced.

(3) By reducing noise voltage and noise current in a detection signal of a source sense terminal, a preferable switching waveform can be obtained, thereby reducing switching loss.

[Effects]

As described above, the semiconductor module 200 according to the present embodiment is a semiconductor module including the main terminal 1, the conductor layer 11 (first conductor plate) electrically connected to the main terminal 1, a plurality of semiconductor switching elements 31 to 38 (plurality of semiconductor chips) of which drains 301 or collectors are connected to the first conductor plate 11, the conductor layer 21 (second conductor plate) connected to the sources or the emitters of a plurality of semiconductor switching elements 31 to 38 and disposed to face the conductor layer 11, the main terminal 2 electrically connected to the conductor layer 21, and the sense terminal 6 that detects the potential of the sources or the emitters of a plurality of semiconductor switching elements 31 to 38. The semiconductor module includes the insulating substrate 10 (first substrate, or first insulating substrate) provided with the main terminal 1, the conductor layer 11, and the sense terminal 6, the insulating substrate 20 (second substrate, or second insulating substrate) disposed to face the insulating substrate 10 and provided with the conductor layer 21, and the sense spacer conductor 81 that is electrically connected to the sense terminal 6, keeps a gap between the insulating substrate 10 and the insulating substrate 20, and is electrically connected to the conductor layer 21, from the side close to the insulating substrate 10, of the insulating substrate 20. The semiconductor module adopts a configuration in which a single sense spacer conductor 81 corresponds to a plurality of semiconductor switching elements 31 to 38, the main terminal 1 is provided at the first side of the insulating substrate 10, the sense spacer conductor 81 and a plurality of semiconductor switching elements 31 to 38 are disposed on the same portion of the first side, and the shortest distance between the sense spacer conductor 81 and the first side is shorter than the shortest distance between the semiconductor chip 31 closest to the main terminal 1, among a plurality of semiconductor switching elements 31 to 38, and the first side.

In the semiconductor module 200, the sense terminal 6 is electrically insulated from the conductor layer 11 (first conductor plate), is disposed on the main surface, on which the conductor layer 11 is disposed, of the insulating substrate 10 (first substrate, or first insulating substrate), and is electrically connected to the third conductor plate 15B facing the conductor layer 21 (second conductor plate), and the sense terminal 6 is, while keeping the distance between the third conductor plate 15B and the second conductor plate 21, connected to the conductor layer 21 via the sense spacer conductor 81 electrically connected to the conductor layer 21 via the third conductor plate 15B.

The main terminal 1 is connected to the conductor layer 11 at the first side of the insulating substrate 10, and the shortest distance between the sense spacer conductor 81 and the main terminal 1 is smaller than the shortest distance between the semiconductor chip 38, which is closest to the main terminal 1 among a plurality of semiconductor chips 31 to 38, and the main terminal 1.

When a gate/source sense drive wiring is routed for each of a plurality of semiconductor chips as in the related art, the area occupied by the wiring increases, which make a module substrate large or reduces the number of the chips to be mounted. In contrast, in the present embodiment, a common source sense wiring is provided for a plurality of semiconductor chips, and the semiconductor chips are connected to the source electrode conductor via the sense spacer conductor 81 dedicated for the senses. As a result, the wiring area can be reduced, that is, the gate/source sense wiring can be shortened and simplified, which enables downsizing of the substrate.

In addition, the noise voltage superposed on the drive signal during switching is generated by a transient large current flowing in a path including a parasitic R or a parasitic L. In the present embodiment, the sense spacer conductor 81 is connected to a portion, of the source electrode conductor, in which the main current does not flow and which is closer to the main terminal 1 (high potential terminal) than the semiconductor chip (the sense spacer conductor 81 is disposed on the highest potential side regarding the flow path from the high potential to the low potential). Thus, the effect of the noise voltage can be lessened.

In addition, by providing the sense spacer conductor 81 connected to the sense terminal 6 at a position of which distance to the main terminal 1 (high potential terminal) is shorter than the path from the main terminal 1 to the semiconductor switching elements 31 to 38, the effect of the noise voltage caused by the currents flowing from the main terminal 1 to each of the semiconductor switching elements 31 to 38 superposed on the source sense voltage can be reduced.

As a result, advantages of downsizing of a module and reduction of switching loss due to reduction of superposition of the switching noise on the drive signal are both obtained. A small SiC module adopting the present invention is suitably applied to EV power conversion devices and industrial power conversion devices.

Second Embodiment

Figure 9:
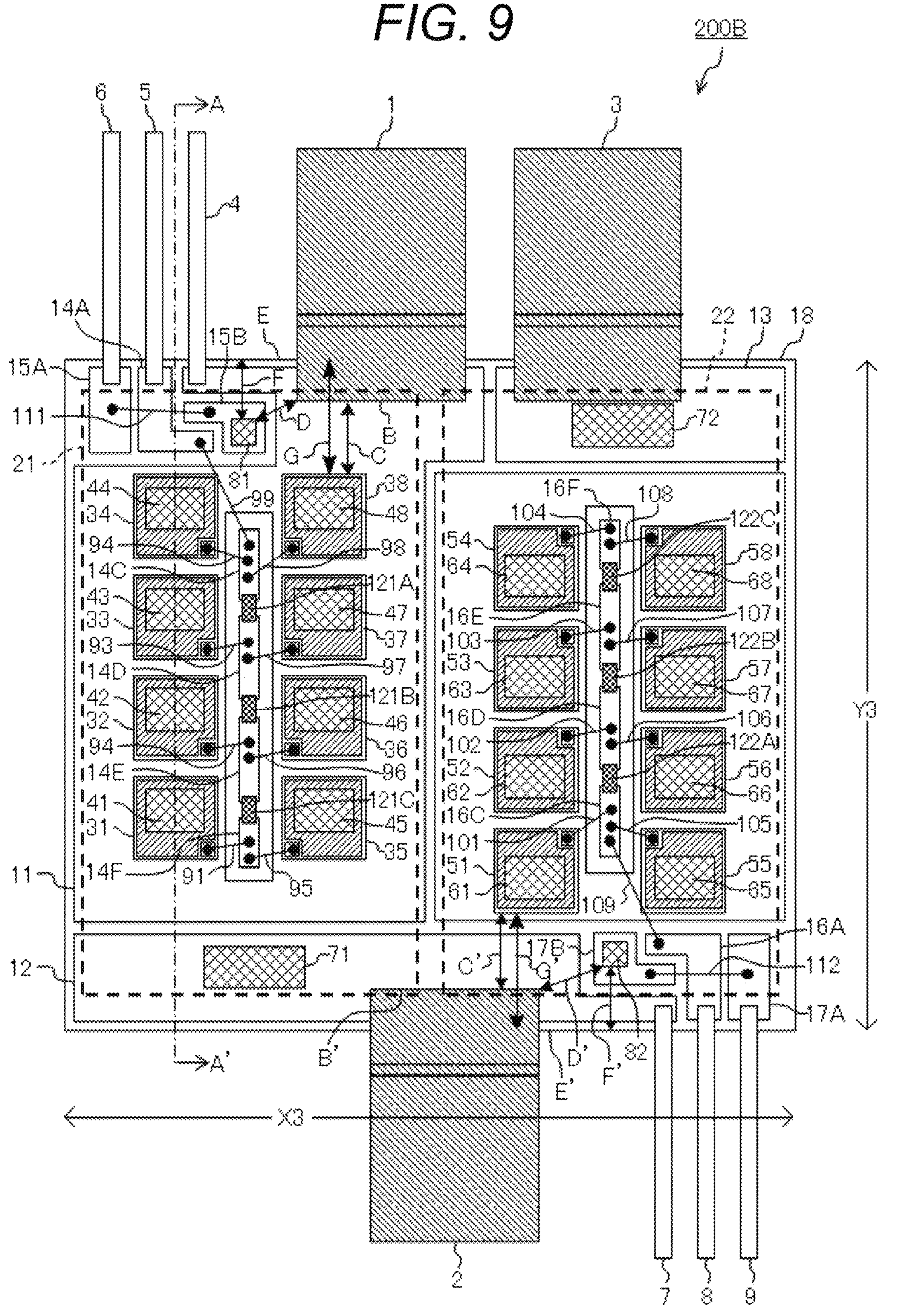
FIG. 9 is a plan view illustrating a schematic configuration of a power semiconductor module of a second embodiment of the present invention.
Figure 10:
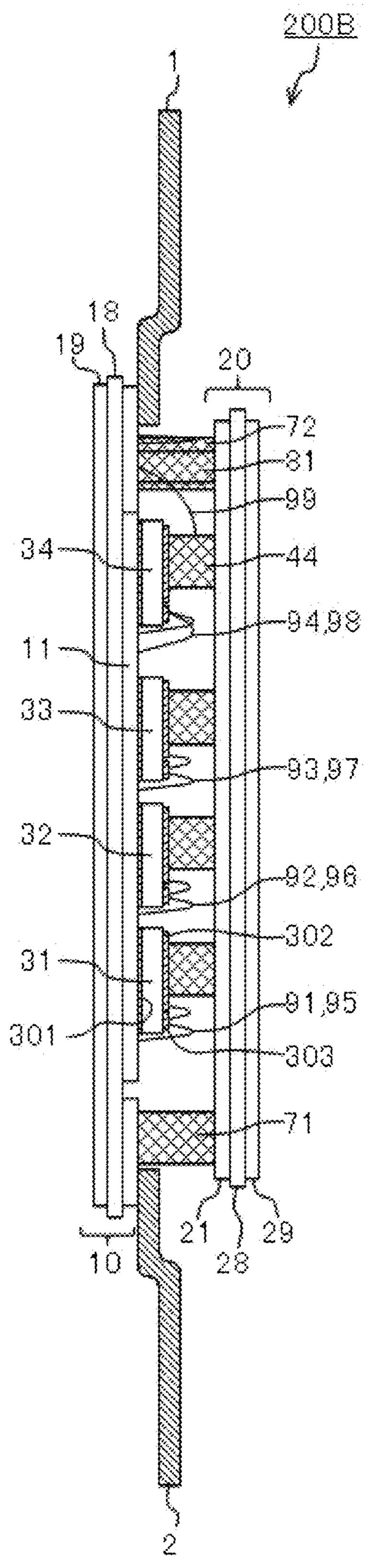
FIG. 10 is a cross-sectional view taken along line A-A' in FIG. 9.

FIG. 9 is a figure illustrating a schematic configuration of a power semiconductor module 200B of a second embodiment of the present invention, and is a plan view of the power semiconductor module 200B as viewed from above. FIG. 10 is a cross-sectional view taken along line A-A' in FIG. 9. The same components as those in FIGS. 1 and 2 are denoted by the same reference signs, and repetitive description thereof is omitted.

In the plan view of FIG. 9, the arrangement of components of a lower layer that is not visible because of components of an upper layer is drawn as if the components of the upper layer are transparent.

[Schematic Configuration]

The power semiconductor module 200B of the present embodiment is different from the power semiconductor module 200 illustrated in FIGS. 1 and 2 in the path and configuration of the wiring on the insulating substrate 10 electrically connected to gate terminals 5 and 8. That is, the power semiconductor module 200B is different from the power semiconductor module 200 illustrated in FIGS. 1 and 2 in the configuration of the gate wiring 14C and the conductor layer 14A on the insulating substrate 10 connected to the gate wiring 14C by the bonding wire 99.

[Planar Structure]

As illustrated in FIG. 9, in the power semiconductor module 200B, the bonding wires 100 and 100A of the power semiconductor module 200 illustrated in FIG. 1 is replaced with bonding wires 111 and 112.

Upper Arm Circuit Configuration

In the power semiconductor module 200B, a gate terminal 5 is electrically connected to a conductor layer 14A, and the conductor layer 14A is connected to a gate wiring conductor layer 14C via a bonding wire 99. The gate wiring conductor layer 14C is electrically connected to the gate electrodes of semiconductor switching elements 34 and 38 respectively via bonding wires 94 and 98.

Meanwhile, the gate electrodes of semiconductor switching elements 33 and 37 are connected to a gate wiring conductor layer 14D, connected to the gate wiring conductor layer 14C via a gate resistor 121A, respectively via bonding wires 93 and 97.

That is, the gate wiring conductor layer 14C and the gate wiring conductor layer 14D are connected in series via a gate resistor 121A, the gate wiring conductor layer 14C is connected to the gate electrodes of the semiconductor switching elements 34 and 38 respectively via bonding wires 94 and 98, and the gate wiring conductor layer 14D is connected to the gate electrodes of the semiconductor switching elements 33 and 37 respectively via bonding wires 93 and 97.

Similarly, the gate electrodes of semiconductor switching elements 32 and 36 are connected to a gate wiring conductor layer 14E, connected to the gate wiring conductor layer 14D via a gate resistor 121B, respectively via bonding wires 94 and 96. Meanwhile, the gate electrodes of semiconductor switching elements 31 and 35 are connected to a gate wiring conductor layer 14F, connected to the gate wiring conductor layer 14E via a gate resistor 121C, respectively via bonding wires 91 and 95.

Lower Arm Circuit Configuration

In the power semiconductor module 200B, a gate terminal 8 is electrically connected to a conductor layer 16A, and the conductor layer 16A is connected to a gate wiring conductor layer 16C via a bonding wire 109. The gate wiring conductor layer 16C is electrically connected to the gate electrodes of semiconductor switching elements 51 and 55 respectively via bonding wires 101 and 105.

Meanwhile, the gate electrodes of semiconductor switching elements 52 and 56 are connected to a gate wiring conductor layer 16D, connected to the gate wiring conductor layer 16C via a gate resistor 122A, respectively via bonding wires 102 and 106.

Similarly, the gate electrodes of semiconductor switching elements 53 and 57 are connected to a gate wiring conductor layer 16E, connected to the gate wiring conductor layer 16D via a gate resistor 122B, respectively via bonding wires 103 and 107. Meanwhile, the gate electrodes of semiconductor switching elements 54 and 58 are connected to a gate wiring conductor layer 16F, connected to the gate wiring conductor layer 16E via a gate resistor 122C, respectively via bonding wires 104 and 108.

An operation of a circuit of the power semiconductor module 200B will be described taking the upper arm circuit configuration as an example.

By adopting the configuration in FIGS. 9 and 10, the potential of a gate drive signal from the conductor layer 14C to the conductor layer 14F changes by the effect of the value of gate drive currents Ig flowing in the conductor layers and the potential difference caused by the gate resistors 121A to 121C. For example, when the gate potentials of the semiconductor switching elements 31 to 34 are Vg31 to Vg34, the magnitude relationship among the potentials during switching, in the case where gate current Ig flowing in the gate terminal 5 flows into the semiconductor switching elements, can be set to satisfy the formula: Vg34>Vg33>Vg32>Vg31.

Figure 11:
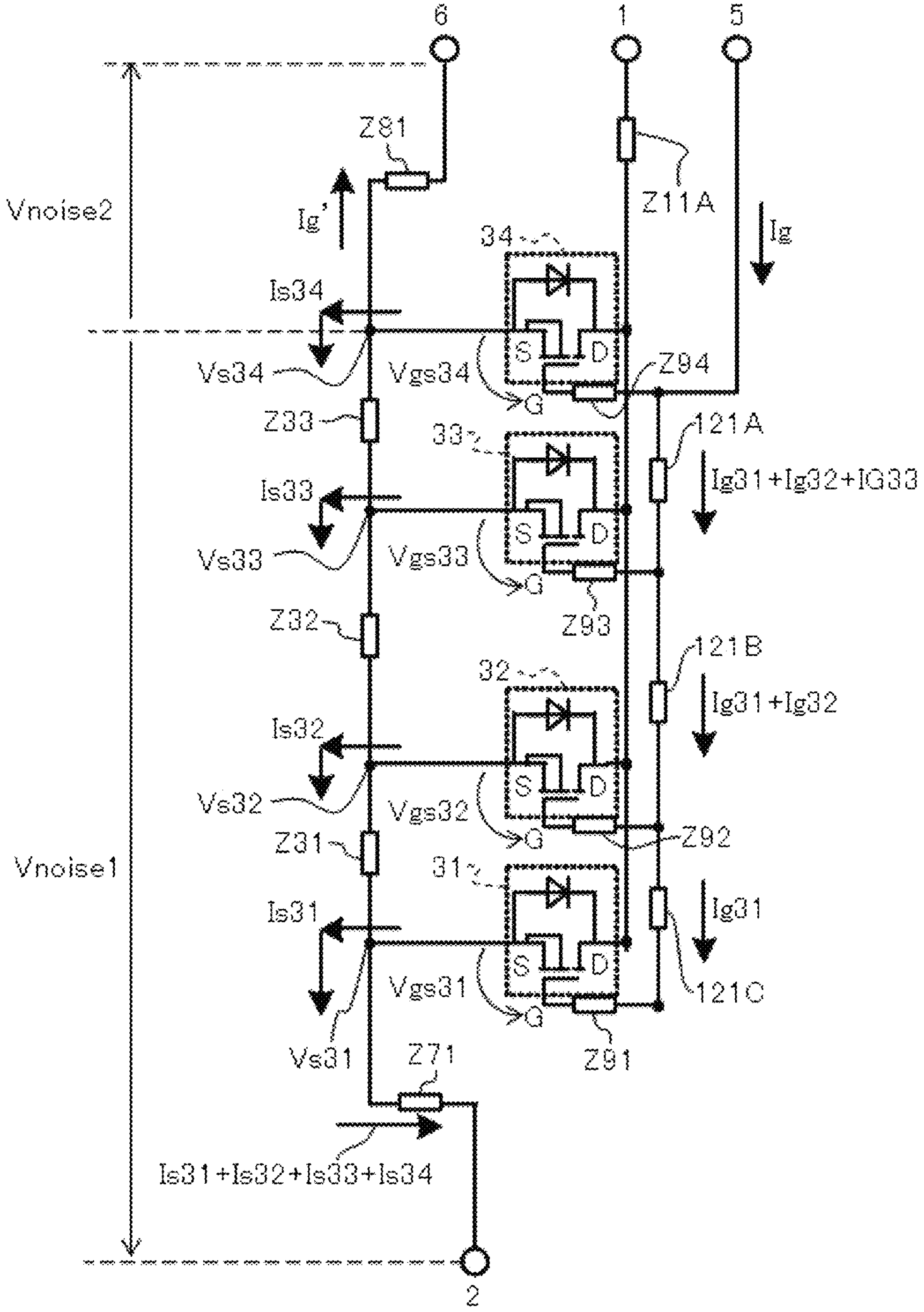
FIG. 11 is an equivalent circuit in which the configuration in FIGS. 9 and 10 is simplified.

FIG. 11 is an equivalent circuit which is a simplified form of the configuration in FIGS. 9 and 10.

As illustrated in FIG. 11, the magnitude relationship among the potentials Vg31 to Vg34 is obtained by voltage drops caused by the gate resistors 121A to 121C. When the source potentials of the semiconductor switching elements are denoted by Vs31 to Vs34, the source currents flowing in parasitic impedances Z31 to Z33 cause the relationship expressed by the formula: Vs34>Vs33>Vs32>Vs31.

By generating the gate potentials Vg31 to Vg34 as described above, the voltage deviations between gate and source Vgs31 to Vgs34 of the semiconductor switching elements can be reduced.

By adopting the configuration in FIGS. 9 and 10, the deviation of Vgs of a plurality of semiconductor switching elements can be suppressed to a small value, and the deviation of magnitude of the current flowing in each semiconductor switching element can be reduced.

In a case where the gate current Ig flowing in the gate terminal 5 flows out of the semiconductor switching element, the following relationship is satisfied.

$$Vg34 < Vg33 < Vg32 < Vg31$$

In this case, a similar effect is obtained.

Furthermore, from the viewpoint of the area of the insulating substrate 10, the power semiconductor module 200B allows a further reduction of area since the conductor layers for routing the gates (14A, 14B, 16A, and 16B) in FIGS. 1 and 2 can be eliminated.

From the stand point of X2 which is the lateral dimension (in the left-right direction in the sheet) and Y2 which is the longitudinal dimension (in the up-down direction in the sheet) of the insulating substrate 10 mentioned in the comparative example in FIG. 3, dimension Y3 illustrated in FIG. 9 is the same as Y2 or smaller than Y2 by a dimension obtained by eliminating 14B and 16B, and for the lateral dimension, X3 in FIG. 9 can be set smaller than X2. Similarly, for example, considering the width of a standard wiring pattern of a power semiconductor module having a rated dielectric strength of 1.2 kV and the insulation distance between patterns, an effect of reducing X3 to 83% of X2 can be obtained. Since the dimension of the insulating substrate 10 is a dominant dimension for determining the dimension of a module when the insulating substrate 10 is designed larger than the insulating substrate 20, the size of the power semiconductor module may be reduced by applying the configuration described in the second embodiment to the present invention.

Thus, the configuration of the second embodiment (FIGS. 9 and 10) has the following specific effects as compared with the first embodiment (FIGS. 1 and 2).

(1) By reducing the voltage deviation between gate and source while reducing noise voltage and noise current in a detection signal of a source sense terminal, the deviation of magnitude of the current flowing in each semiconductor switching element can further be reduced.

(2) The area of an insulating substrate on which the semiconductor switching element is mounted can further be reduced.

(3) A power semiconductor module on which the insulating substrate described in (2) is mounted can be downsized.

As described above, in the power semiconductor module 200B, the gate terminal 5 is electrically connected to the gate electrodes of a plurality of semiconductor switching elements 31 to 38 via a plurality of bonding wires 91 to 98 and the conductor layers 14C to 14F (gate wiring conductor plate group) constituted by a plurality of conductor plates disposed on the main surface, on which the conductor layer 11 (first conductor plate) is disposed, of the insulating substrate 10.

For example, the gate drive voltage provided from the gate terminal 5 is provided to the gate electrode of each of a plurality of semiconductor chips 31 to 38 at a different voltage level. In the case where the gate current flows into the gate electrode of each of a plurality of semiconductor chips 31 to 38, the gate drive voltage is given to the switching element of the semiconductor close to the main terminal 1, among a plurality of the semiconductor chips 31 to 38, at a high voltage level and is given to the switching element 35 of the semiconductor close to the main terminal 2 but far from the main terminal 1, among a plurality of semiconductor chips 31 to 38, at a low voltage level. In the case where the gate current flows out of the gate electrode of each of a plurality of semiconductor chips 31 to 38, the gate drive voltage is given to the switching element of the semiconductor close to the main terminal 1, among a plurality of semiconductor chips 31 to 38, at a low voltage level and is given to the switching element 35 of the semiconductor close to the main terminal 2 but far from the main terminal 1, among a plurality of semiconductor chips 31 to 38, at a high voltage level.

In general, in a power semiconductor module, a noise voltage needs to be suppressed when supplying a Vgs drive signal to each chip during switching. In the present embodiment, potential differences are created on the gate wiring to equalize the Vgs of the chips. This provides an effect of equalized operation of the chips in addition to the effect of the first embodiment, that is, reduction of area and reduction of drive signal noise.

Third Embodiment

Figure 12:
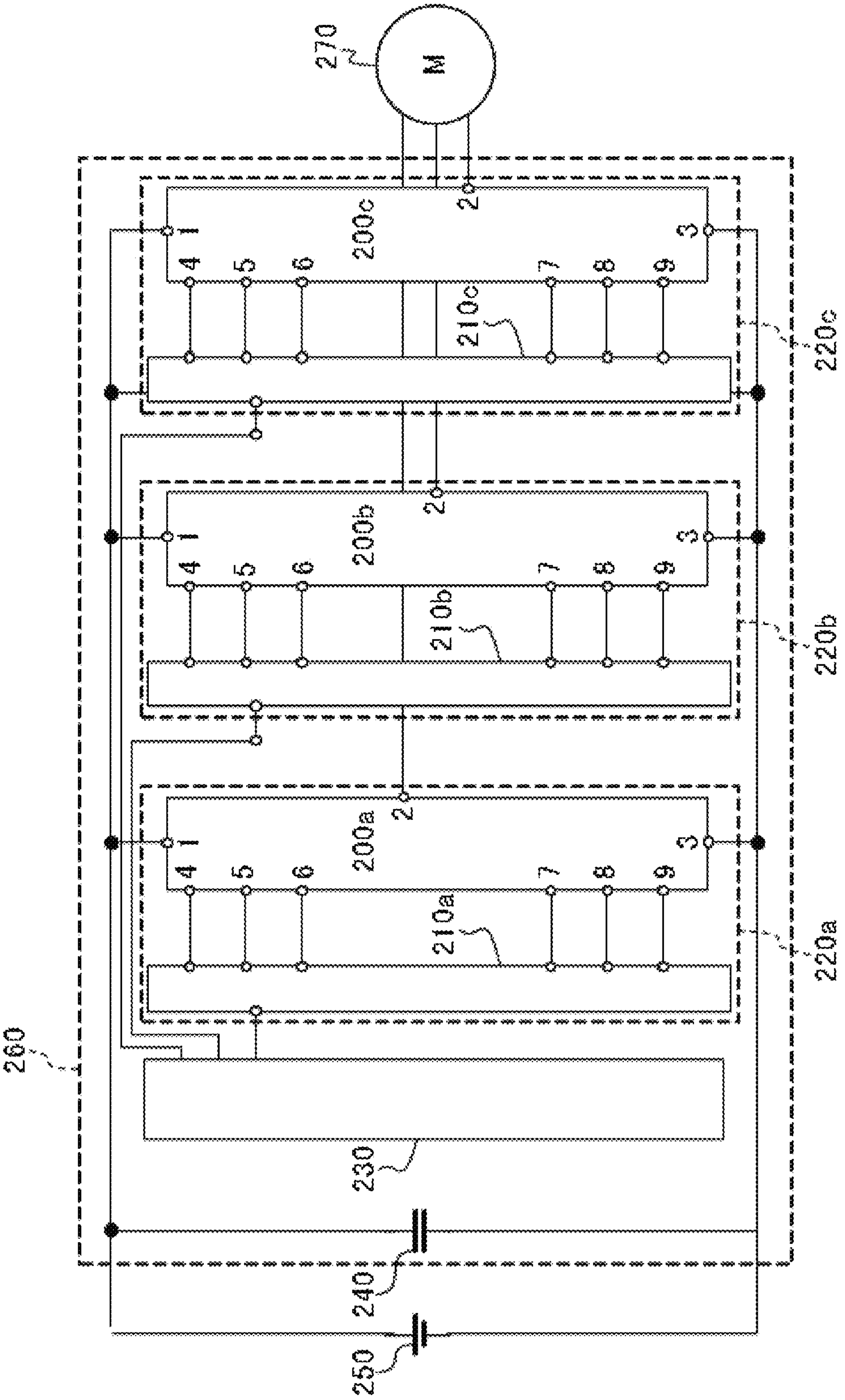
FIG. 12 is a block diagram illustrating a configuration of a power conversion device including a power semiconductor module of a third embodiment of the present invention.

FIG. 12 is a block diagram illustrating a configuration of a power conversion device including a power semiconductor module of a third embodiment of the present invention. The present embodiment is an example application of a three-phase AC motor that drives an axle of an electric vehicle including a battery 250, a power conversion device 260, and an electric motor 270 as a load.

The power conversion device 260 of the present embodiment includes three leg circuits each for a single phase and configured by a 2-in-1 power semiconductor modules 200 (200*a*, 200*b*, 200*c*), a capacitor 240, and a control circuit 230. The power conversion device 260 includes a gate drive circuits 210 (210*a*, 210*b*, 210*c*) by a number equal to the number of AC phases.

In the power conversion device 260, the capacitor 240 keeps the main voltage (Vcc), and the gate drive signal of the semiconductor switching element in each power semiconductor module 200 generated by the control circuit 230 is input to each power semiconductor module 200 via the gate drive circuit 210*a*, 210*b*, or 210*c*.

The leg circuits 220*a*, 220*b*, and 220*c* respectively constitute a first-phase inverter leg, a second-phase inverter leg, and a third-phase inverter leg. The output of each inverter leg is connected to the electric motor 270.

In the present embodiment, the leg circuits 220*a*, 220*b*, and 220*c* have the same circuit configuration. Thus, the circuit configuration will be described for the leg circuit 220*a* as an example.

The leg circuit 220*a* includes a pair of upper and lower arms configured by the power semiconductor module 200*a*, and a gate drive circuit 210*a* that performs on/off control of the power semiconductor module 200*a*.

The power semiconductor module 200*a* constitutes a single leg circuit of a half bridge circuit. A main terminal 1, a main terminal 2, and a main terminal 3 are included as main terminals. Included as auxiliary terminals are a drain sense terminal 4 for sensing a drain voltage, a gate terminal 5, and a source sense terminal 6 for the upper arm and a drain sense terminal 7, a gate terminal 8, and a source sense terminal 9 for the lower arm.

According to the present embodiment, the power semiconductor module described in either the power semiconductor module 200 of the first embodiment or the power semiconductor module 200B of the second embodiment is used as the power semiconductor module 200 mounted on the power conversion device 260.

By the power conversion device 260 including the power semiconductor modules 200 and 200B, the power conversion device 260 and a motor drive system for an electric vehicle including the power conversion device 260 can be downsized.

Since noise voltage and noise current superposed on the source sense path embedded in the power semiconductor modules 200 and 200B can be reduced, switching loss in the power semiconductor modules 200 and 200B can be reduced as compared with the module configuration of the comparative example. Thus, the power conversion device 260 and the motor drive system for an electric vehicle including the power conversion device 260 can be downsized, and the loss thereof can be reduced.

The present invention is not limited to the embodiments described above, and includes other exemplary modifications and exemplary applications unless they do not depart from the gist of the present invention described in the claims. For example, the embodiments described above are described in detail for easy understanding of the present invention. The present invention is not necessarily limited to embodiments including all the described configurations. In addition, part of the configuration of an embodiment can be replaced with the configuration of another embodiment, and the configuration of an embodiment can be added to the configuration of another embodiment. A part of the configuration of an embodiment may be replaced with a different configuration or eliminated, or a different configuration may be added to a part of the configuration of an embodiment.

For example, a dimension and an insulation distance of a member constituting the power semiconductor module 200 may be determined optionally according to the application.

Furthermore, the chip arrangement of the semiconductor switching elements constituting the power semiconductor module 200 is not limited to that illustrated in the drawings.

For the example in which the upper and lower arms are mounted on the same power semiconductor module 200, description has been focused on one of the arm circuits, but a similar effect can be obtained by the other arm circuit, and adoption of a 2-in-1 configuration does not reduce the effect. Contrary, it is widely known that adopting a 2-in-1 configuration provides an ancillary effect of reducing the parasitic inductance by the effect of the main currents that flow in power semiconductor switching elements flowing in opposite directions in conductor layers close to each other. It is a preferred example from the viewpoint of providing a high-performance power semiconductor module.

Other than a MOSFET, the power semiconductor module 200 may be either a unipolar device such as a junction field effect transistor (JFET) or a bipolar device such as an IGBT. Depending on a device, a main terminal and a sense terminal are referred to as "collector" and "emitter" instead of "drain" and "source" as described above.

In addition, the mode of the power semiconductor module may be a three-phase full bridge circuit using three or more power semiconductor modules 200, instead of the 2-in-1 of the power semiconductor module 200 described in the example and a 1-in-1 type module including a single arm circuit.

The power conversion device to which the power semiconductor module 1 is applied can also be applied to, besides a motor drive system for an electric vehicle, a power conditioning system (PCS) in a solar power generator, a railway vehicle electrical system, and the like.

REFERENCE SIGNS LIST

1 main terminal
2 main terminal
3 main terminal
4, 7 sense terminal (drain sense terminal)
5, 8 gate terminal
6, 9 sense terminal (source sense terminal)
10 insulating substrate (first substrate, or first insulating substrate)
11 conductor layer (first conductor plate)
14C to 14F conductor layer (gate wiring conductor plate group)
15B, 17B conductor layer (third conductor plate)
16B conductor layer (relay conductor)
16C gate wiring
18 insulating layer
19 conductor layer
20 insulating substrate (second substrate, or second insulating substrate)
21 conductor layer (second conductor plate)
28 insulating layer
29 conductor layer
31 to 38, 51 to 58 semiconductor switching element (semiconductor chip)
41 to 48, 71, 72, 61 to 68 spacer conductor
81, 82 sense spacer conductor
91 to 99, 101 to 109, 110 bonding wire
121, 122 gate resistor
200, 200B power semiconductor module
210 gate drive circuit
220 leg circuit
230 control circuit
240 capacitor
250 battery or power supply circuit
260 power conversion device
270 electric motor

301 semiconductor chip drain electrode
302 semiconductor chip source electrode
303 gate electrode of semiconductor chip
B, B' side
C, C' distance
D, D' distance
E, E' side
F, F' distance
G, G' distance

The invention claimed is:

1. A power semiconductor module comprising:
a high potential terminal;
a first conductor plate electrically connected to the high potential terminal;
a plurality of semiconductor chips of which drains or collectors are connected to the first conductor plate;
a second conductor plate connected to sources or emitters of the plurality of semiconductor chips and disposed to face the first conductor plate;
a low potential terminal electrically connected to the second conductor plate;
a sense terminal configured to detect potentials of the sources or emitters of the plurality of semiconductor chips;
a first substrate on which the high potential terminal, the first conductor plate, and the sense terminal are provided;
a second substrate disposed to face the first substrate and provided with the second conductor plate;
a sense spacer conductor that is electrically connected to the sense terminal, keeps a gap between the first substrate and the second substrate, and is electrically connected to the second conductor plate of the second substrate from the first substrate, wherein:
the sense spacer conductor, which is single, corresponds to the plurality of semiconductor chips,
the high potential terminal is provided at a first side of the first substrate,
the sense spacer conductor and the plurality of semiconductor chips are disposed on a same portion of the first side, and
a shortest distance between the sense spacer conductor and the first side is smaller than a shortest distance between a semiconductor chip closest to the high potential terminal, among the plurality of semiconductor chips, and the first side,
a first insulating substrate as the first substrate on one of which main surfaces the first conductor plate is disposed; and
a second insulating substrate as the second substrate on one of which main surfaces the second conductor plate is disposed, wherein:
the first insulating substrate and the second insulating substrate are disposed such that the first conductor plate and the second conductor plate face each other,
the sense terminal is electrically insulated from the first conductor plate, is disposed on the main surface, on which the first conductor plate is disposed, of the first insulating substrate, and is electrically connected to a third conductor plate facing the second conductor plate,
the sense terminal keeps a distance between the third conductor plate and the second conductor plate, and is connected to the second conductor plate via the sense spacer conductor electrically connected to the second conductor plate via the third conductor plate,
the high potential terminal is connected to the first conductor plate at the first side of the first insulating substrate, and
a shortest distance between the sense spacer conductor and the high potential terminal is smaller than a shortest distance between the semiconductor chip closest to the high potential terminal, among the plurality of semiconductor chips, and the high potential terminal.

2. The power semiconductor module according to claim 1, wherein a shortest distance between the sense spacer conductor and the first side is smaller than the shortest distance between the semiconductor chip closest to the high potential terminal, among the plurality of semiconductor chips, and the first side.

3. The power semiconductor module according to claim 1, wherein in the second conductor plate, a position at which the plurality of semiconductor chips are electrically connected is between a position at which the sense spacer conductor is electrically connected and a position at which the low potential terminal is electrically connected.

4. The power semiconductor module according to claim 1, wherein
a planar positional relationship among the high potential terminal, the sense spacer conductor, the plurality of semiconductor chips, and the low potential terminal is that, when viewed from a position where the high potential terminal is electrically connected to the first conductor plate, the sense spacer conductor, the plurality of semiconductor chips, and a position at which the low potential terminal is electrically connected to the second conductor plate are arranged in this order.

5. The power semiconductor module according to claim 1, wherein the sense terminal and a gate terminal, together with the high potential terminal, are provided at the first side of the first substrate.

6. The power semiconductor module according to claim 5, wherein the gate terminal is electrically connected to gate electrodes of the plurality of semiconductor chips via a first gate wiring conductor plate group and a plurality of bonding wires, the first gate wiring conductor plate group including a plurality of conductor plates disposed on the main surface, on which the first conductor plate is disposed, of the first substrate.

7. The power semiconductor module according to claim 5, wherein
a gate drive voltage provided from the gate terminal is provided to a gate electrode of each of the plurality of semiconductor chips at a different voltage level,
when a gate current flows into the gate electrode of each of the plurality of semiconductor chips, a switching element of a semiconductor close to the high potential terminal, among the plurality of semiconductor chips, is given a high voltage level, and a switching element of a semiconductor far from the high potential terminal and close to the low potential terminal, among the plurality of semiconductor chips, is given a low voltage level, and
when the gate current flows out of the gate electrode of each of the plurality of semiconductor chips, the switching element of the semiconductor close to the high potential terminal, among the plurality of semiconductor chips, is given a low voltage level, and the switching element of the semiconductor far from the high potential terminal and close to the low potential terminal, among the plurality of semiconductor chips, is given a high voltage level.

8. A power conversion device comprising:

a main circuit including one or more pairs of upper and lower arms; and a drive circuit that drives the upper and lower arms, wherein the upper and lower arms include the power semiconductor module according to claim 1.

9. A power semiconductor module comprising:

a high potential terminal;

a first conductor plate electrically connected to the high potential terminal;

a plurality of semiconductor chips of which drains or collectors are connected to the first conductor plate;

a second conductor plate connected to sources or emitters of the plurality of semiconductor chips and disposed to face the first conductor plate;

a low potential terminal electrically connected to the second conductor plate;

a sense terminal configured to detect potentials of the sources or emitters of the plurality of semiconductor chips;

a first substrate on which the high potential terminal, the first conductor plate, and the sense terminal are provided;

a second substrate disposed to face the first substrate and provided with the second conductor plate; and a sense spacer conductor that is electrically connected to the sense terminal, keeps a gap between the first substrate and the second substrate, and is electrically connected to the second conductor plate of the second substrate from the first substrate, wherein:

the sense spacer conductor, which is single, corresponds to the plurality of semiconductor chips, the high potential terminal is provided at a first side of the first substrate, the sense spacer conductor and the plurality of semiconductor chips are disposed on a same portion of the first side, a shortest distance between the sense spacer conductor and the first side is smaller than a shortest distance between a semiconductor chip closest to the high potential terminal, among the plurality of semiconductor chips, and the first side, and a planar positional relationship among the high potential terminal, the sense spacer conductor, the plurality of semiconductor chips, and the low potential terminal is that, when viewed from a position where the high potential terminal is electrically connected to the first conductor plate, the sense spacer conductor, the plurality of semiconductor chips, and a position at which the low potential terminal is electrically connected to the second conductor plate are arranged in this order.

10. The power semiconductor module according to claim 9, further comprising:

a first insulating substrate as the first substrate on one of which main surfaces the first conductor plate is disposed; and a second insulating substrate as the second substrate on one of which main surfaces the second conductor plate is disposed, wherein the first insulating substrate and the second insulating substrate are disposed such that the first conductor plate and the second conductor plate face each other, the sense terminal is electrically insulated from the first conductor plate, is disposed on the main surface, on which the first conductor plate is disposed, of the first insulating substrate, and is electrically connected to a third conductor plate facing the second conductor plate, and the sense terminal keeps a distance between the third conductor plate and the second conductor plate, and is connected to the second conductor plate via the sense spacer conductor electrically connected to the second conductor plate via the third conductor plate.

11. The power semiconductor module according to claim 9, wherein in the second conductor plate, a position at which the plurality of semiconductor chips are electrically connected is between a position at which the sense spacer conductor is electrically connected and the position at which the low potential terminal is electrically connected.

12. The power semiconductor module according to claim 9, wherein the sense terminal and a gate terminal, together with the high potential terminal, are provided at the first side of the first substrate.

13. The power semiconductor module according to claim 12, wherein the gate terminal is electrically connected to gate electrodes of the plurality of semiconductor chips via a first gate wiring conductor plate group and a plurality of bonding wires, the first gate wiring conductor plate group including a plurality of conductor plates disposed on the main surface, on which the first conductor plate is disposed, of the first substrate.

14. The power semiconductor module according to claim 12, wherein a gate drive voltage provided from the gate terminal is provided to a gate electrode of each of the plurality of semiconductor chips at a different voltage level, when a gate current flows into the gate electrode of each of the plurality of semiconductor chips, a switching element of a semiconductor close to the high potential terminal, among the plurality of semiconductor chips, is given a high voltage level, and a switching element of a semiconductor far from the high potential terminal and close to the low potential terminal, among the plurality of semiconductor chips, is given a low voltage level, and when the gate current flows out of the gate electrode of each of the plurality of semiconductor chips, the switching element of the semiconductor close to the high potential terminal, among the plurality of semiconductor chips, is given a low voltage level, and the switching element of the semiconductor far from the high potential terminal and close to the low potential terminal, among the plurality of semiconductor chips, is given a high voltage level.

15. A power conversion device comprising:

a main circuit including one or more pairs of upper and lower arms; and a drive circuit that drives the upper and lower arms, wherein the upper and lower arms include the power semiconductor module according to claim 11.

16. A power semiconductor module comprising:

a high potential terminal;

a first conductor plate electrically connected to the high potential terminal;

a plurality of semiconductor chips of which drains or collectors are connected to the first conductor plate;

a second conductor plate connected to sources or emitters of the plurality of semiconductor chips and disposed to face the first conductor plate;

a low potential terminal electrically connected to the second conductor plate;

a sense terminal configured to detect potentials of the sources or emitters of the plurality of semiconductor chips;

a first substrate on which the high potential terminal, the first conductor plate, and the sense terminal are provided;

a second substrate disposed to face the first substrate and provided with the second conductor plate; and a sense spacer conductor that is electrically connected to the sense terminal, keeps a gap between the first substrate and the second substrate, and is electrically connected to the second conductor plate of the second substrate from the first substrate, wherein:

the sense spacer conductor, which is single, corresponds to the plurality of semiconductor chips, the high potential terminal is provided at a first side of the first substrate, the sense spacer conductor and the plurality of semiconductor chips are disposed on a same portion of the first side, a shortest distance between the sense spacer conductor and the first side is smaller than a shortest distance between a semiconductor chip closest to the high potential terminal, among the plurality of semiconductor chips, and the first side, the sense terminal and a gate terminal, together with the high potential terminal, are provided at the first side of the first substrate, and the gate terminal is electrically connected to gate electrodes of the plurality of semiconductor chips via a first gate wiring conductor plate group and a plurality of bonding wires, the first gate wiring conductor plate group including a plurality of conductor plates disposed on the main surface, on which the first conductor plate is disposed, of the first substrate.

17. The power semiconductor module according to claim 16, wherein a gate drive voltage provided from the gate terminal is provided to the gate electrode of each of the plurality of semiconductor chips at a different voltage level, when a gate current flows into the gate electrode of each of the plurality of semiconductor chips, a switching element of a semiconductor close to the high potential terminal, among the plurality of semiconductor chips, is given a high voltage level, and a switching element of a semiconductor far from the high potential terminal and close to the low potential terminal, among the plurality of semiconductor chips, is given a low voltage level, and when the gate current flows out of the gate electrode of each of the plurality of semiconductor chips, the switching element of the semiconductor close to the high potential terminal, among the plurality of semiconductor chips, is given a low voltage level, and the switching element of the semiconductor far from the high potential terminal and close to the low potential terminal, among the plurality of semiconductor chips, is given a high voltage level.

18. The power semiconductor module according to claim 16, wherein in the second conductor plate, a position at which the plurality of semiconductor chips are electrically connected is between a position at which the sense spacer conductor is electrically connected and a position at which the low potential terminal is electrically connected.

19. The power semiconductor module according to claim 16, wherein a planar positional relationship among the high potential terminal, the sense spacer conductor, the plurality of semiconductor chips, and the low potential terminal is that, when viewed from a position where the high potential terminal is electrically connected to the first conductor plate, the sense spacer conductor, the plurality of semiconductor chips, and a position at which the low potential terminal is electrically connected to the second conductor plate are arranged in this order.

20. A power conversion device comprising:

a main circuit including one or more pairs of upper and lower arms; and a drive circuit that drives the upper and lower arms, wherein the upper and lower arms include the power semiconductor module according to claim 16.

* * * * *